(12) United States Patent
Lee et al.

(10) Patent No.: US 10,726,999 B2
(45) Date of Patent: Jul. 28, 2020

(54) COMPOSITE ELECTRONIC COMPONENT AND BOARD HAVING THE SAME

(71) Applicant: SAMSUNG ELECTRO-MECHANICS CO., LTD., Suwon-si, Gyeonggi-do (KR)

(72) Inventors: Sang Jong Lee, Suwon-si (KR); Han Kim, Suwon-si (KR); Seung Hee Hong, Suwon-si (KR); Min Ki Jung, Suwon-si (KR); Su Bong Jang, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 372 days.

(21) Appl. No.: 15/664,931

(22) Filed: Jul. 31, 2017

(65) Prior Publication Data

US 2018/0174758 A1 Jun. 21, 2018

(30) Foreign Application Priority Data

Dec. 20, 2016 (KR) .................. 10-2016-0174614

(51) Int. Cl.
*H01G 4/40* (2006.01)
*H01G 4/232* (2006.01)
(Continued)

(52) U.S. Cl.
CPC ........... *H01G 4/40* (2013.01); *H01F 27/2804* (2013.01); *H01F 27/29* (2013.01); *H01F 27/292* (2013.01);
(Continued)

(58) Field of Classification Search
CPC .......... H01G 4/40; H01G 4/012; H01G 4/232; H01G 4/1227; H01F 27/2804; H01F 27/40; H01F 2027/2809
(Continued)

(56) References Cited

U.S. PATENT DOCUMENTS 5,592,134 A * 1/1997 Ogata .................. C04B 35/491
333/185
6,504,451 B1 1/2003 Yamaguchi
(Continued)

FOREIGN PATENT DOCUMENTS

CN 1298226 A 6/2001
CN 1411143 A 4/2003
(Continued)

OTHER PUBLICATIONS

Korean Search Report for KR Patent Application No. 10-2016-0174614, dated, Aug. 13, 2009.
Office Action issued in corresponding Chinese Patent Application No. 201711016724.5 dated Nov. 1, 2019, with English translation.

* cited by examiner

*Primary Examiner* — Danny Nguyen
(74) *Attorney, Agent, or Firm* — Morgan, Lewis & Bockius LLP

(57) ABSTRACT

A composite electronic component includes a body including a capacitor unit and an inductor unit and having a plurality of insulating layers stacked in a first direction perpendicular to a mounting surface of the body. A plurality of external electrodes are on external surfaces of the body. The capacitor unit includes first and second internal electrodes alternately stacked with insulating layers interposed therebetween. The inductor unit includes a coil including coil patterns having a spiral shape, on respective insulating layers, and connected together.

19 Claims, 24 Drawing Sheets

(51) Int. Cl.
*H01G 4/012* (2006.01)
*H01G 4/30* (2006.01)
*H01F 27/28* (2006.01)
*H01F 27/29* (2006.01)
*H01F 27/40* (2006.01)
*H01F 27/32* (2006.01)
*H05K 1/11* (2006.01)
*H05K 1/18* (2006.01)
*H01G 4/12* (2006.01)

(52) U.S. Cl.
CPC .............. *H01F 27/32* (2013.01); *H01F 27/40* (2013.01); *H01G 4/012* (2013.01); *H01G 4/232* (2013.01); *H01G 4/30* (2013.01); *H01F 2027/2809* (2013.01); *H01G 4/1227* (2013.01); *H05K 1/111* (2013.01); *H05K 1/181* (2013.01); *H05K 2201/1003* (2013.01); *H05K 2201/1006* (2013.01); *H05K 2201/10015* (2013.01)

(58) Field of Classification Search
USPC .......................................... 361/270, 117–119
See application file for complete search history.

(56) References Cited

U.S. PATENT DOCUMENTS

| | | | |
|---|---|---|---|
| 2003/0080830 A1 | 5/2003 | Matsumura et al. | |
| 2009/0189715 A1 | 7/2009 | Sakisaka | |
| 2011/0037540 A1* | 2/2011 | Matsushita | H01P 1/20345 |
| | | | 333/204 |
| 2014/0313785 A1 | 10/2014 | Lee | |
| 2015/0061791 A1* | 3/2015 | Imamura | H03H 7/09 |
| | | | 333/185 |
| 2015/0310994 A1 | 10/2015 | Yosui et al. | |
| 2016/0344181 A1 | 11/2016 | Matsunaga | |

FOREIGN PATENT DOCUMENTS

| | | |
|---|---|---|
| CN | 104113195 A | 10/2014 |
| CN | 104426496 A | 3/2015 |
| CN | 204721322 U | 10/2015 |
| CN | 106169697 A | 11/2016 |
| JP | 2009-182376 A | 8/2009 |
| JP | 5540912 B2 | 7/2014 |
| KR | 10-0232547 B1 | 3/2000 |

COMPOSITE ELECTRONIC COMPONENT AND BOARD HAVING THE SAME

CROSS-REFERENCE TO RELATED APPLICATION(S)

This application claims benefit of priority to Korean Patent Application No. 10-2016-0174614 filed on Dec. 20, 2016 in the Korean Intellectual Property Office, the disclosure of which is incorporated herein by reference in its entirety.

BACKGROUND

1. Field

The present disclosure relates to a composite electronic component and a board having the same.

2. Description of Related Art

Electronic products such as cellular phones and the like can use signals within multiple frequency bands, and the frequency bands used by such electronic products have recently been extended.

In a radio frequency (RF) system, a combination inductor and capacitor is used for an impedance matching circuit or a filter.

Due to the use of the signals within multiple frequency bands and the extension of the frequency bands in electronic products, the use of inductors and capacitors for high frequency transmission and reception has increased.

At the same time, due to the thinning and miniaturization of electronic components, the demand for miniaturization of passive elements has increased.

SUMMARY

An aspect of the present disclosure may provide a composite electronic component of which amounting area may be significantly reduced.

According to an aspect of the present disclosure, a composite electronic component may include a body including a capacitor unit and an inductor unit and having a plurality of insulating layers stacked in a first direction parallel to a mounting surface of the body. A plurality of external electrodes may be on external surfaces of the body. The capacitor unit may include first and second internal electrodes alternately stacked with insulating layers interposed therebetween. The inductor unit may include a coil including coil patterns having a spiral shape, on respective insulating layers, and connected together.

According to another aspect of the present disclosure, a board having a composite electronic component may include: a printed circuit board having first and second electrode pads on one surface thereof and the composite electronic component mounted on the printed circuit board. The composite electronic component may include a body including a capacitor unit and an inductor unit and having a plurality of insulating layers stacked in a first direction parallel to a mounting surface of the body. A plurality of external electrodes may be on external surfaces of the body. The capacitor unit may include first and second internal electrodes alternately stacked with insulating layers interposed therebetween. The inductor unit may include a coil including coil patterns having a spiral shape, on respective insulating layers, connected together.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
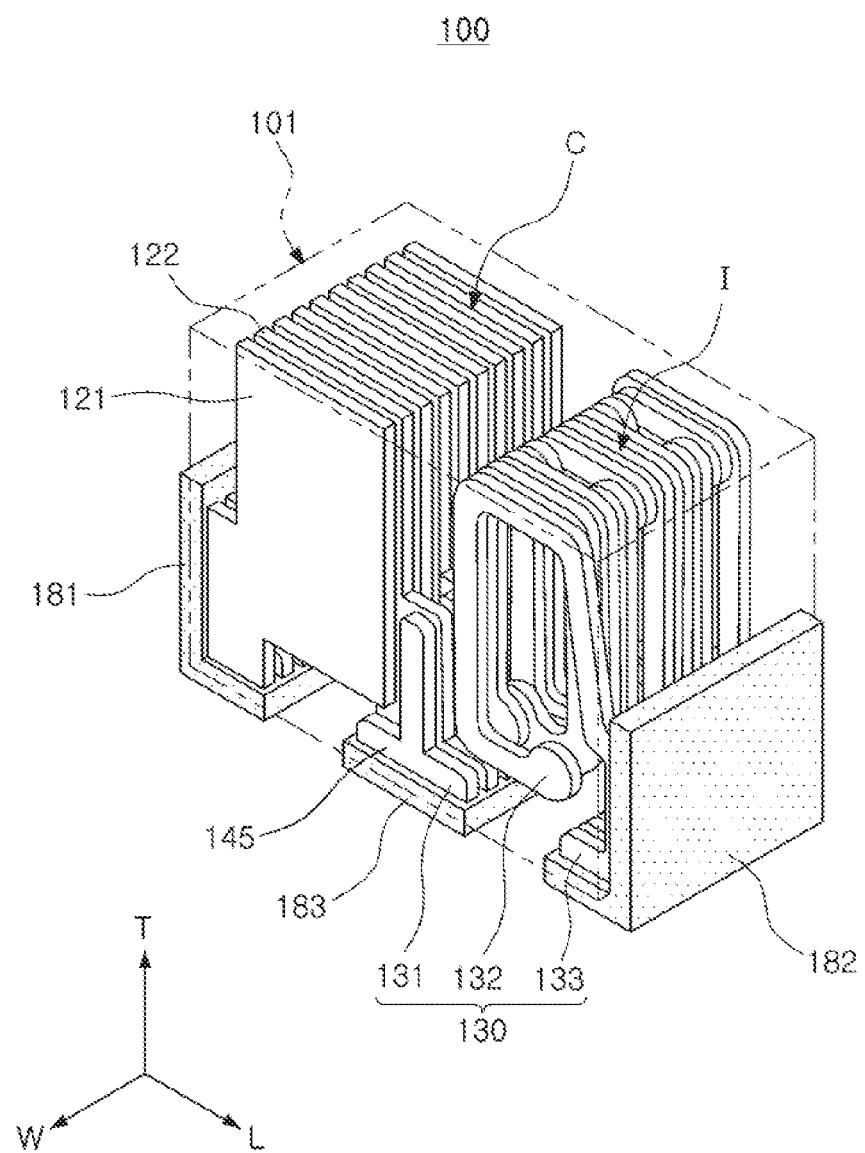
FIG. 1 is a schematic perspective view illustrating a composite electronic component according to a first exemplary embodiment in the present disclosure.

Hereinafter, exemplary embodiments of the present disclosure will be described in detail with reference to the accompanying drawings.

Hereinafter, a first direction, a second direction, and a third direction refer to W, L, and T directions in the drawings, respectively.

Composite Electronic Component

Figure 2:
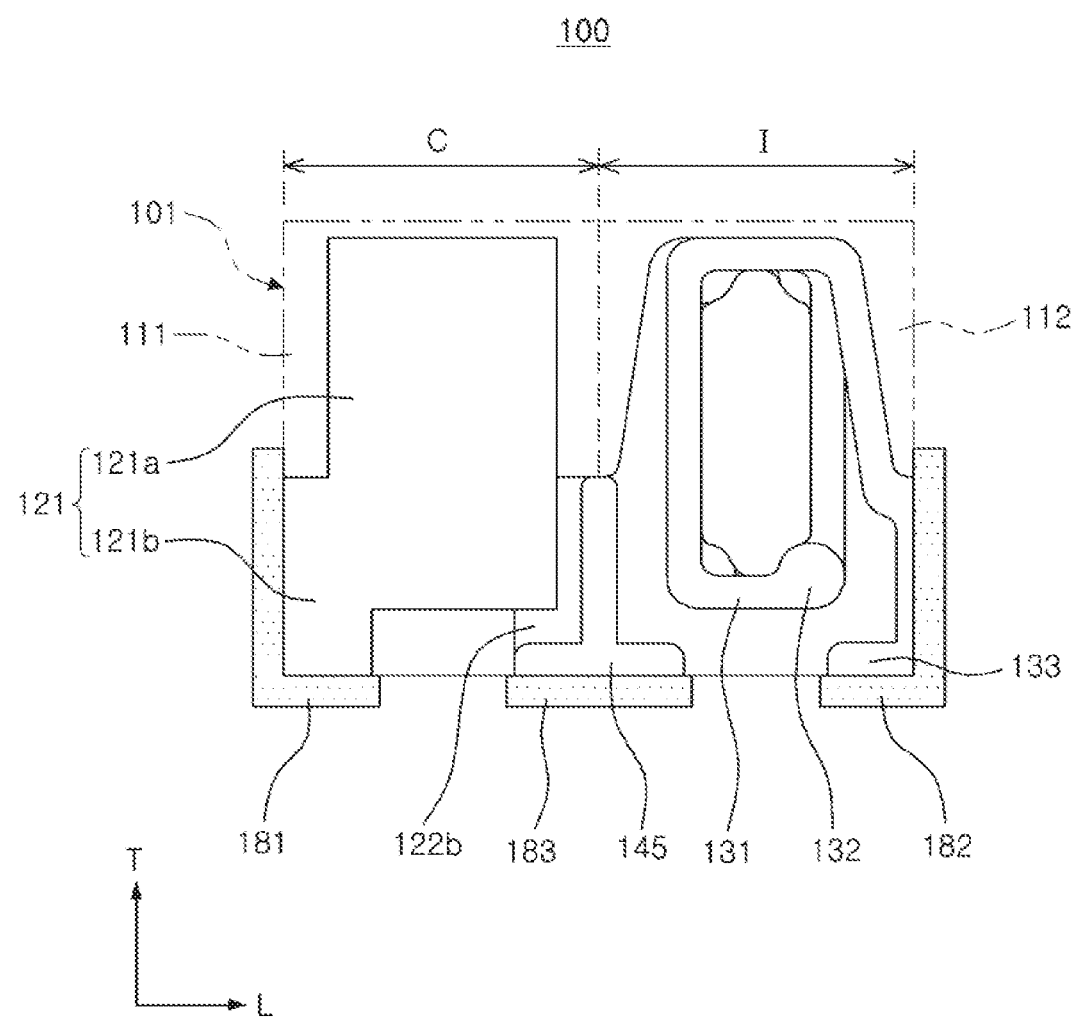
FIG. 2 is a schematic front view illustrating the composite electronic component of FIG. 1.
Figure 3:
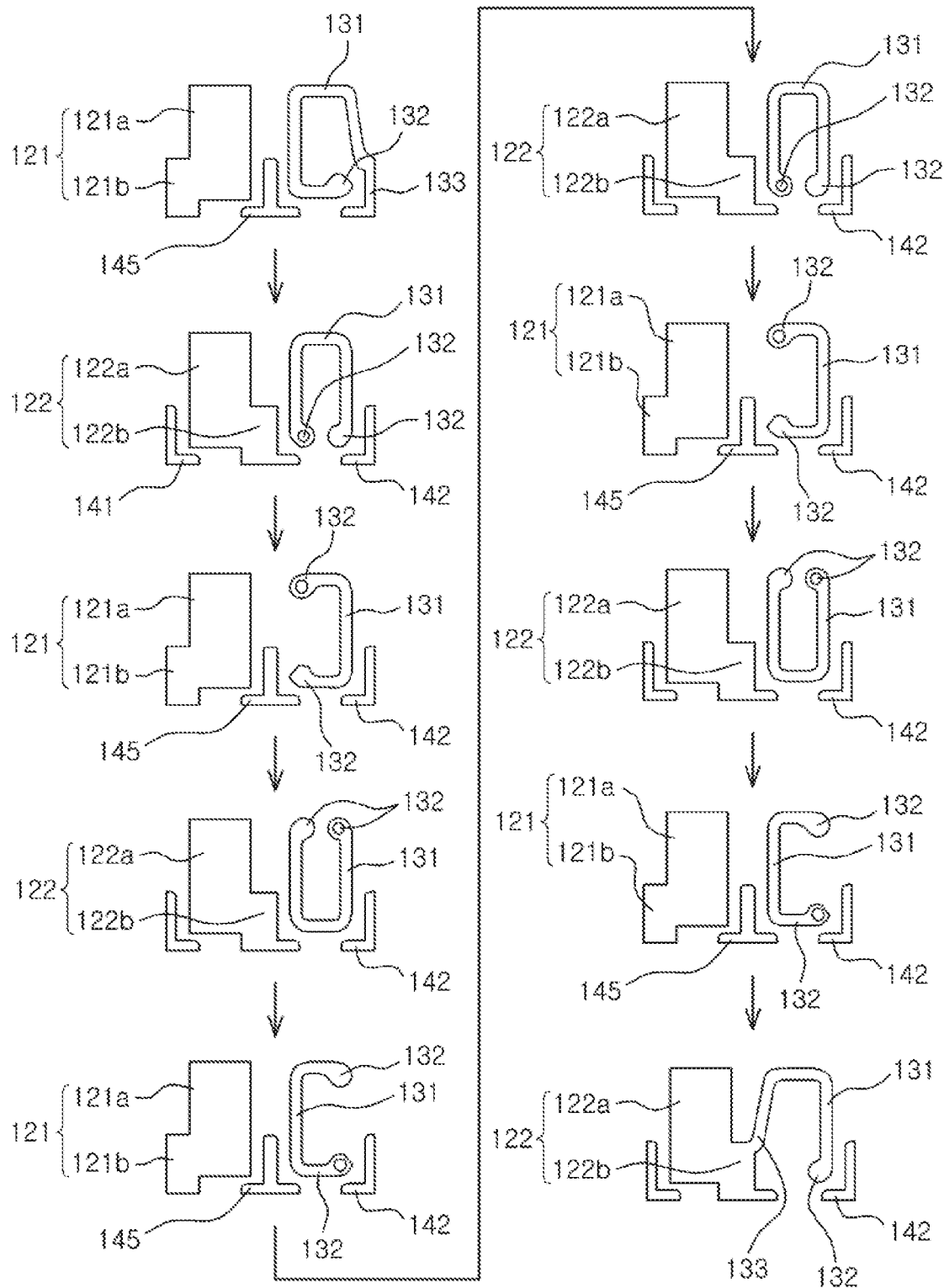
FIG. 3 is a plan view illustrating electrode patterns included in the composite electronic component of FIG. 1 depending on a stacking sequence.

FIG. 1 is a schematic perspective view illustrating a composite electronic component 100 according to a first exemplary embodiment in the present disclosure. FIG. 2 is a schematic front view illustrating the composite electronic component 100 of FIG. 1. FIG. 3 is a plan view illustrating electrode patterns included in the composite electronic component 100 of FIG. 1 depending on a stacking sequence.

The composite electronic component 100 according to the first exemplary embodiment will be described with reference to FIGS. 1 through 3.

A body 101 of the composite electronic component 100 according to the first exemplary embodiment may be formed by stacking a plurality of insulating layers 111 and 112 in the first direction, parallel to a mounting surface.

The body 101 may include a capacitor unit C and an inductor unit I. The capacitor unit C and the inductor unit I may respectively be disposed on opposing sides of the body 101 in the second direction perpendicular to the first direction and parallel to the mounting surface.

First insulating layers 111 refer to insulating layers disposed in the capacitor unit C, and second insulating layers 112 refer to insulating layers disposed in the inductor unit I.

The first and second insulating layers 111 and 112 may be formed of the same material, but may also be formed of different materials, if necessary.

When the first and second insulating layers 111 and 112 are formed of the different materials, the first insulating layer 111 may be a dielectric layer, and the second insulating layer 112 may be a magnetic layer.

The dielectric layer may include barium titanate (BaTiO$_3$)-based ceramic powders, and the like. An example of the barium titanate (BaTiO$_3$)-based ceramic powder may include (Ba$_{1-x}$Ca$_x$)TiO$_3$, Ba(Ti$_{1-y}$Ca$_y$)O$_3$, (Ba$_{1-x}$Ca$_x$)(Ti$_{1-y}$Zr$_y$)O$_3$, Ba(Ti$_{1-y}$Zr$_y$)O$_3$, or the like, in which calcium (Ca), zirconium (Zr), or the like, is partially dissolved in BaTiO$_3$. However, an example of the barium titanate (BaTiO$_3$)-based ceramic powder is not limited thereto.

The magnetic layer may include any material that may be used as a material of a body of an inductor. For example, a resin, ceramic, ferrite, or the like, may be used as the material of the magnetic layer. In the present exemplary embodiment, a photosensitive insulating material may be used as the material of the magnetic layer so that fine patterns may be implemented through a photolithography process. That is, the magnetic layer may be formed of the photosensitive insulating material, and coil patterns 131, coil connection parts 132, and the like, may thus be finely formed to contribute to miniaturization and performance improvement of the composite electronic component 100. To this end, for example, a photosensitive organic material or a photosensitive resin may be included in the magnetic layer. The magnetic layer may further include an inorganic component such as SiO$_2$/Al$_2$O$_3$/BaSO$_4$/Talc, or the like, as a filler component, in addition to the materials described above.

The capacitor unit C may include first internal electrodes 121 and second internal electrodes 122 disposed with respective first insulating layers 111 interposed therebetween.

The first and second internal electrodes 121 and 122 may include first and second capacitor capacitance portions 121a and 122a and first and second capacitor lead portions 121b and 122b, respectively.

The first and second capacitor capacitance portions 121a and 122a may be portions in which the first and second internal electrodes 121 and 122 overlap each other, when viewed in the first direction, with respective first insulating layers 111 interposed therebetween, and may form a capacitance.

The first and second capacitor capacitance portions 121a and 122a of the composite electronic component 100 according to the first exemplary embodiment may be formed in a flat plate shape to be elongated in the third direction perpendicular to the mounting surface.

The first and second capacitor capacitance portions 121a and 122a may be connected to first and third external electrodes 181 and 183 to be described below through the first and second capacitor lead portions 121b and 122b, respectively.

The inductor unit I may include a coil 130 formed by connecting the coil patterns 131 disposed on the second insulating layers 112 and having a spiral shape, together through the coil connection parts 132.

FIG. 2 shows that the coil 130 forms a spiral trajectory when viewed in the first direction.

The trajectory of the coil of the composite electronic component 100 according to the first exemplary embodiment may have a rectangular shape formed to be elongated in the third direction, perpendicular to the mounting surface.

The end portions of the coil 130 may be respectively connected to second and third external electrodes 182 and 183 through coil lead portions 133.

In the composite electronic component 100 according to the exemplary embodiment, the third external electrode 183 may serve as a connection electrode to connect the capacitor unit C and the inductor unit I to each other in series.

Referring to FIG. 3, the internal electrodes 121 and 122 and the coil patterns 131 may be formed together.

The first internal electrode 121 and the coil pattern 131 or the second internal electrode 122 and the coil pattern 131 may be formed on one insulating layer, and the respective insulating layers may be stacked and compressed in a sequence as illustrated in FIG. 3.

In the composite electronic component 100 according to the first exemplary embodiment, the internal electrodes 121 and 122 and the coil patterns 131 may be disposed to be perpendicular to the mounting surface to thus prevent a magnetic flux generated from the inductor unit from being affected by the mounting surface of a board.

A conductive material such as copper (Cu), aluminum (Al), silver (Ag), tin (Sn), gold (Au), nickel (Ni), and lead (Pb), metals having excellent conductivity, or alloys thereof, may be used as a material of each of the internal electrodes 121 and 122, the coil patterns 131, the coil connection parts 132, and the coil lead portions 133.

The internal electrodes 121 and 122, the coil patterns 131, the coil connection parts 132, and the coil lead portions 133 may be formed by a plating method or a printing method, but are not limited thereto.

The coil patterns 131 adjacent to each other may be connected to each other through the coil connection parts 132. The coil connection parts 132 may have line widths greater than those of the coil patterns 131, and include conductive vias penetrating through the insulating layers.

Since the composite electronic component 100 according to the first exemplary embodiment is manufactured by forming the internal electrodes 121 and 122, the coil patterns 131, and the like, together on the insulating layers and stacking the insulating layers in the first direction, parallel to the mounting surface, the composite electronic component 100 may be more easily manufactured as compared to the related art.

In particular, when the materials of the first and second insulating layers 111 and 112 are the same as each other, the composite electronic component 100 may be manufactured without performing a separate additional process.

Dummy electrodes 141, 142, and 145 may be disposed on portions of the insulating layers in contact with the external electrodes 181, 182, and 183, respectively. The dummy electrodes 141, 142, and 145 may serve to improve close adhesion between the external electrodes 181, 182, and 183 and the body 101, and may serve as a bridge when the external electrodes are formed by plating.

The external electrodes 181, 182, and 183 may be disposed on external surfaces of the body 101. For example, the external electrodes 181, 182, and 183 may be disposed on a surface to be used as the mounting surface when the composite electronic component 100 is mounted on the board.

The capacitor lead portions of the internal electrodes 121 and 122 and the coil lead portions of the coil may be exposed to the mounting surface, such that the internal electrodes 121 and 122 and the coil may be connected to one of the external electrodes 181, 182, and 183.

The external electrodes 181, 182, and 183 may serve to electrically connect to the composite electronic component 100 and the body to each other when the composite electronic component 100 is mounted on a printed circuit board (PCB). The external electrodes 181, 182, and 183 may include the first and second external electrodes 181 and 182 disposed, respectively, on edges of the mounting surface of the body 101 in the second direction, spaced apart from each other, and the third external electrode 183 disposed between the first and second external electrodes 181 and 182. The external electrodes 181, 182, and 183 may include, for example, conductive resin layers and conductor layers formed on the conductive resin layers, respectively, but are not limited thereto. The conductive resin layer may include one or more conductive metals selected from the group consisting of copper (Cu), nickel (Ni), and silver (Ag), and a thermosetting resin. The conductor layer may include one or more selected from the group consisting of nickel (Ni), copper (Cu), and tin (Sn). For example, a nickel (Ni) layer and a tin (Sn) layer may be sequentially formed in the conductor layer.

Table 1 is a table comparing inductor characteristics and capacitor characteristics of an electronic component (Comparative Example 1) including only an inductor and an electronic component (Comparative Example 2) including only a capacitor and inductor characteristics and capacitor characteristics of the composite electronic component 100 according to the first exemplary embodiment in the present disclosure with each other.

TABLE 1

| 구분 | Inductor unit | | | | Capacitor |
|---|---|---|---|---|---|
| | L [nH] | Q | Rs [Ω] | Rs [Ω] | C [nF] |
| Frequency | 0.5 [GHz] | 2.4 [GHz] | 2.4 [GHz] | 0.001 [GHz] | 30 [kHz] |
| Comparative Example 1 | 4.00 | 40.37 | 1.60 | 0.16 | — |
| Comparative Example 2 | — | — | — | — | 0.0022 |
| First Embodiment Example | 4.23 | 39.17 | 1.65 | 0.16 | 0.0022 |

Table, 1 shows that the composite electronic component 100 according to the first exemplary embodiment in the present disclosure has inductor characteristics similar to those of the electronic component according to Comparative Example 1 and has capacitor characteristics similar to those of the electronic component according to Comparative Example 2.

The composite electronic component 100 according to the first exemplary embodiment including both of the capacitor and the inductor may be mounted in an area in which one electronic component may be mounted, resulting in a significant increase in a degree of freedom of a design and mounting efficiency.

The contents described in the first exemplary embodiment may hereinafter be applied to other exemplary embodiments.

Figure 4:
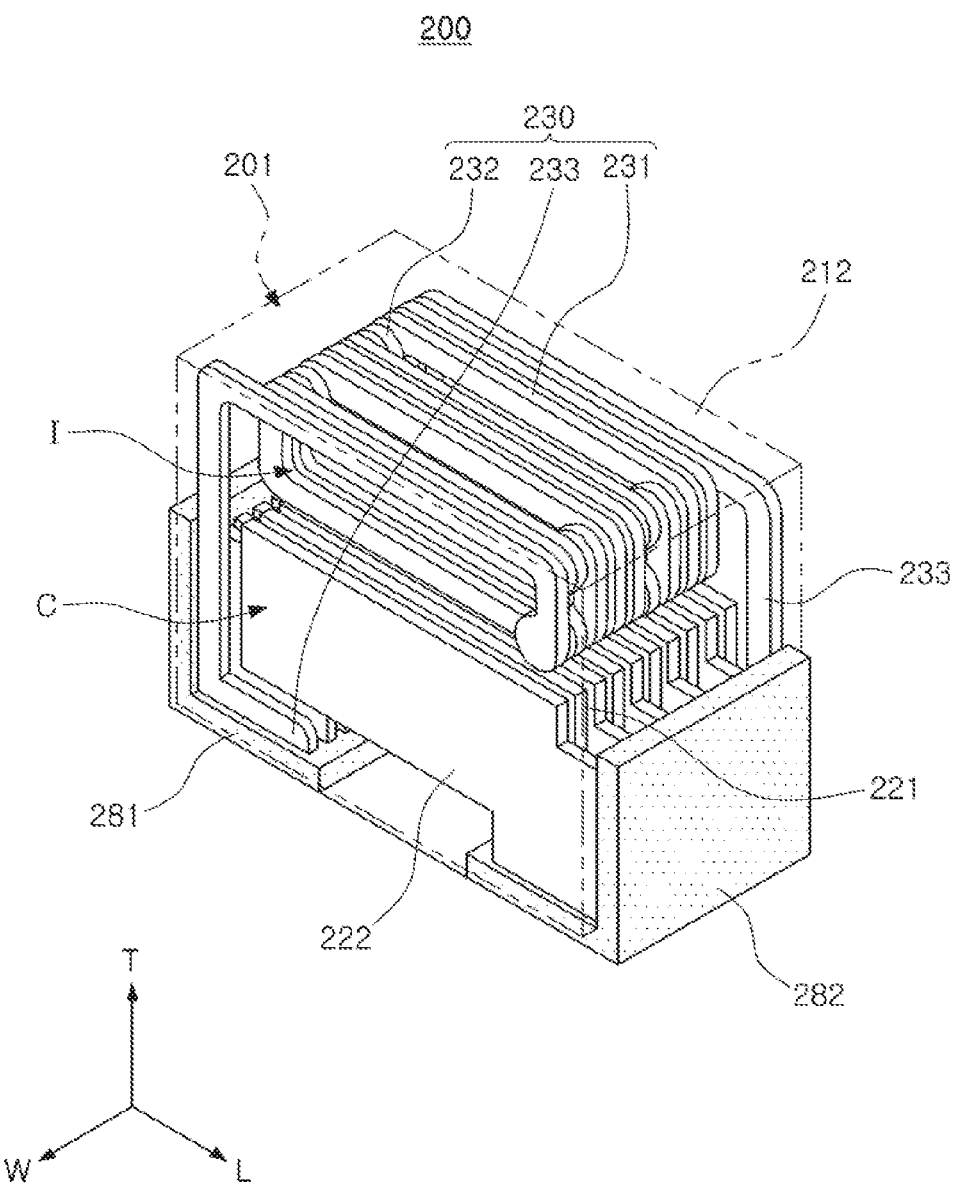
FIG. 4 is a schematic perspective view illustrating a composite electronic component according to a second exemplary embodiment in the present disclosure.
Figure 5:
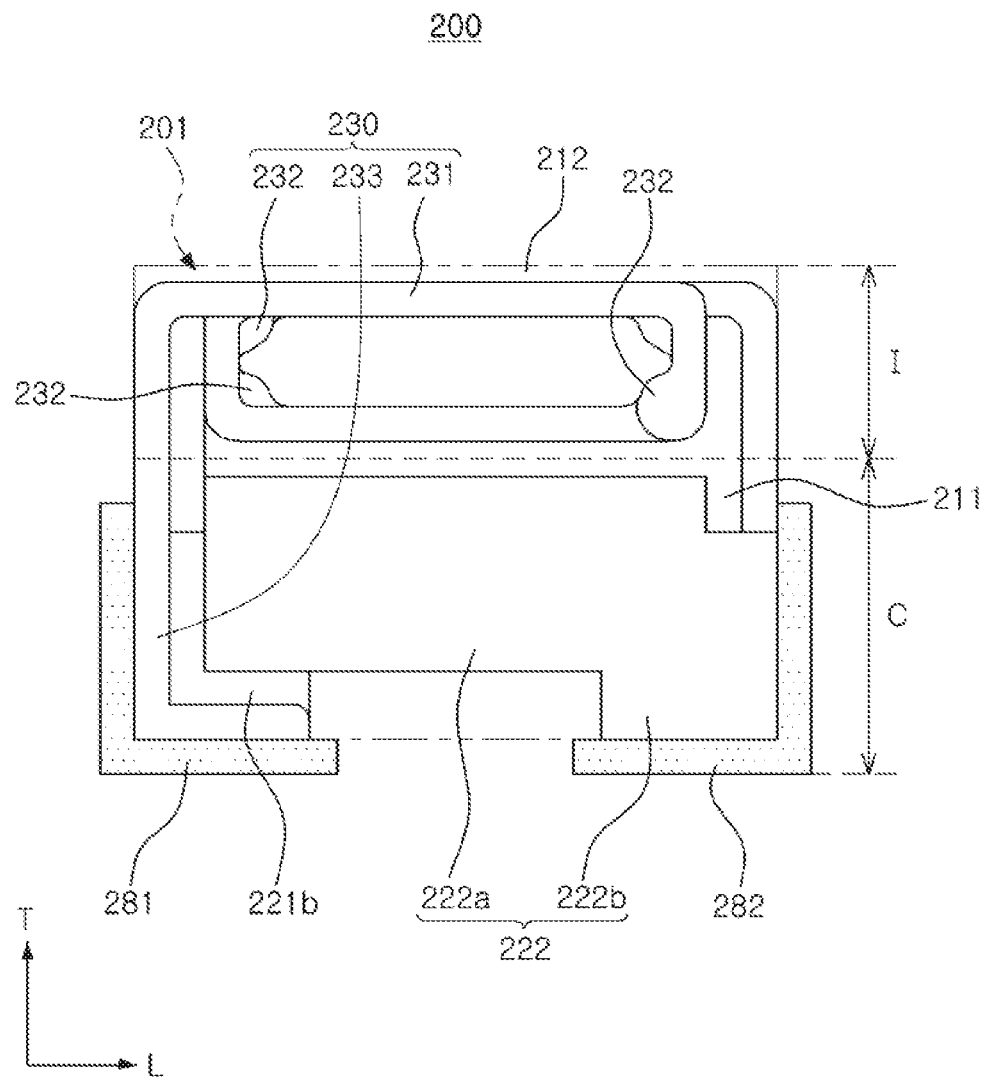
FIG. 5 is a schematic front view illustrating the composite electronic component of FIG. 4.
Figure 6:
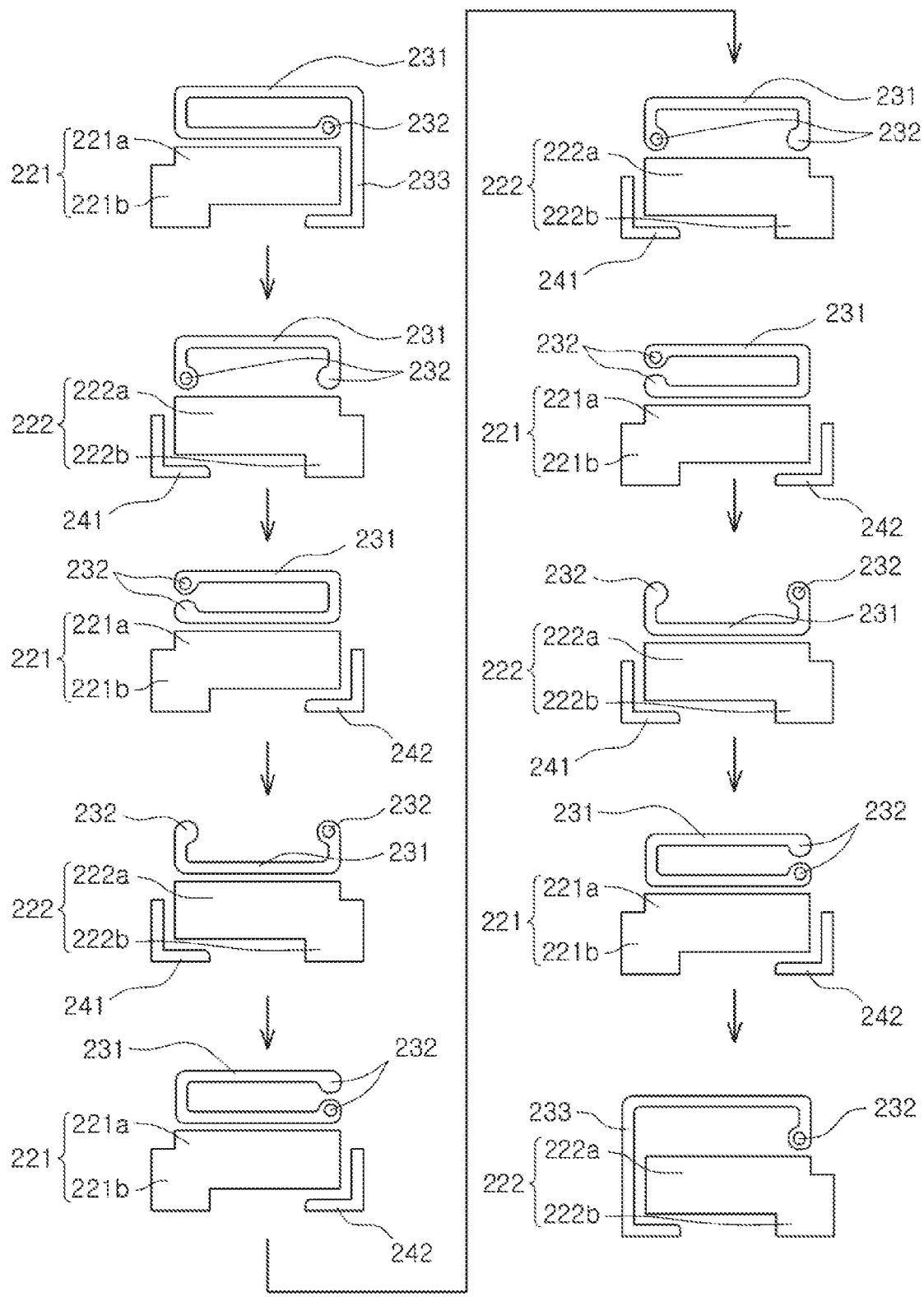
FIG. 6 is a plan view illustrating electrode patterns included in the composite electronic component of FIG. 4 depending on a stacking sequence.

FIG. 4 is a schematic perspective view illustrating a composite electronic component 200 according to a second exemplary embodiment in the present disclosure. FIG. 5 is a schematic front view illustrating the composite electronic component 200 of FIG. 4. FIG. 6 is a plan view illustrating electrode patterns included in the composite electronic component 200 of FIG. 4 depending on a stacking sequence.

The composite electronic component 200 according to the second exemplary embodiment will be described with reference to FIGS. 4 through 6.

A body 201 of the composite electronic component 200 according to the second exemplary embodiment may be formed by stacking a plurality of insulating layers 211 and 212 in the first direction, parallel to the mounting surface.

The body 201 may include a capacitor unit C and an inductor unit I, and the capacitor unit C and the inductor unit I may be disposed, respectively, at opposing side portions of the body 201 in the third direction, which is perpendicular to the first direction and the second direction, and perpendicular to the mounting surface.

First insulating layers 211 refer to insulating layers disposed in the capacitor unit C, and second insulating layers 212 refer to insulating layers disposed in the inductor unit I.

The first and second insulating layers 211 and 212 may be formed of the same material, but may also be formed of different materials, if necessary.

When the first and second insulating layers 211 and 212 are formed of the different materials, the first insulating layer 211 may be a dielectric layer, and the second insulating layer 212 may be a magnetic layer.

The capacitor unit C may include first internal electrodes 221 and second internal electrodes 222 disposed with respective first insulating layers 211 interposed therebetween.

The first and second internal electrodes 221 and 222 may include first and second capacitor capacitance portions 221a and 222a and first and second capacitor lead portions 221b and 222b, respectively.

The first and second capacitor capacitance portions 221a and 222a of the composite electronic component 200 according to the second exemplary embodiment may be formed in a flat plate shape to be elongated in the second direction perpendicular to the first direction and parallel to the mounting surface.

The first and second capacitor capacitance portions 221a and 222a may be portions in which the first and second internal electrodes 221 and 222 overlap each other with respective first insulating layers 211 interposed therebetween, and may form a capacitance.

The first and second capacitor capacitance portions 221a and 222a may be connected to first and second external electrodes 281 and 282 to be described below through the first and second capacitor lead portions 221b and 222b, respectively.

The inductor unit I may include a coil 230 formed by connecting coil patterns 231 disposed on the second insulating layers 212 and having a spiral shape together through coil connection parts 232.

FIG. 5 shows that the coil 230 forms a spiral trajectory when viewed in the first direction.

The trajectory of the coil of the composite electronic component 200 according to the second exemplary embodiment may have a rectangular shape formed to be elongated in the second direction.

The end portions of the coil 230 may respectively be connected to the first and second external electrodes 281 and 282 through coil lead portions 233.

In the composite electronic component 200 according to the second exemplary embodiment, both of the capacitor unit C and the inductor unit I may be connected to the first and second external electrodes 281 and 282, and the capacitor unit C and the inductor unit I may thus be connected to each other in parallel.

Referring to FIG. 6, the internal electrodes 221 and 222 and the coil patterns 231 may be formed together.

The first internal electrode 221 and the coil pattern 231 or the second internal electrode 222 and the coil pattern 231 may be formed on one insulating layer, and the respective insulating layers may be stacked and compressed in a sequence as illustrated in FIG. 6.

In the composite electronic component 200 according to the second exemplary embodiment, the internal electrodes 221 and 222 and the coil patterns 231 may be disposed to be perpendicular to the mounting surface to thus prevent a magnetic flux generated from the inductor unit from being affected by the mounting surface of the board.

The coil patterns 231 adjacent to each other may be connected to each other through the coil connection parts 232. The coil connection parts 232 may have line widths greater than those of the coil patterns 231, and include conductive vias penetrating through the insulating layers.

Since the composite electronic component 200 according to the second exemplary embodiment is manufactured by forming the internal electrodes 221 and 222, the coil patterns 231, and the like, together on the insulating layers and stacking the insulating layers in the first direction, parallel to the mounting surface, the composite electronic component 200 may be more easily manufactured as compared to the related art.

Particularly, when materials of the first and second insulating layers 211 and 212 are the same as each other, the composite electronic component 200 may be manufactured without performing a separate additional process.

Dummy electrodes 241 and 242 may be disposed on portions of the insulating layers in contact with the external electrodes 281 and 282, respectively. The dummy electrodes 241 and 242 may serve to improve close adhesion between the external electrodes 281 and 282 and the body 201, and may serve as abridge when the external electrodes are formed by plating.

The external electrodes 281 and 282 may be disposed on external surfaces of the body 201. For example, the external electrodes 281 and 282 may be disposed on a surface provided as the mounting surface when the composite electronic component 200 is mounted on the board.

The capacitor lead portions of the internal electrodes 221 and 222 and the coil lead portions of the coil 230 may be exposed to the mounting surface, such that the internal electrodes 221 and 222 and the coil 230 may be connected to one of the external electrodes 281 and 282.

The external electrodes 281 and 282 may include the first and second external electrodes 281 and 282 disposed, respectively, on edges of the mounting surface of the body 201 in the second direction spaced apart from each other.

The composite electronic component 200 according to the second exemplary embodiment including both of the capacitor and the inductor may be mounted in an area in which one electronic component may be mounted, resulting in a significant increase in a degree of freedom of a design and mounting efficiency.

The contents described in the second exemplary embodiment may hereinafter be applied to other exemplary embodiments.

Figure 7:
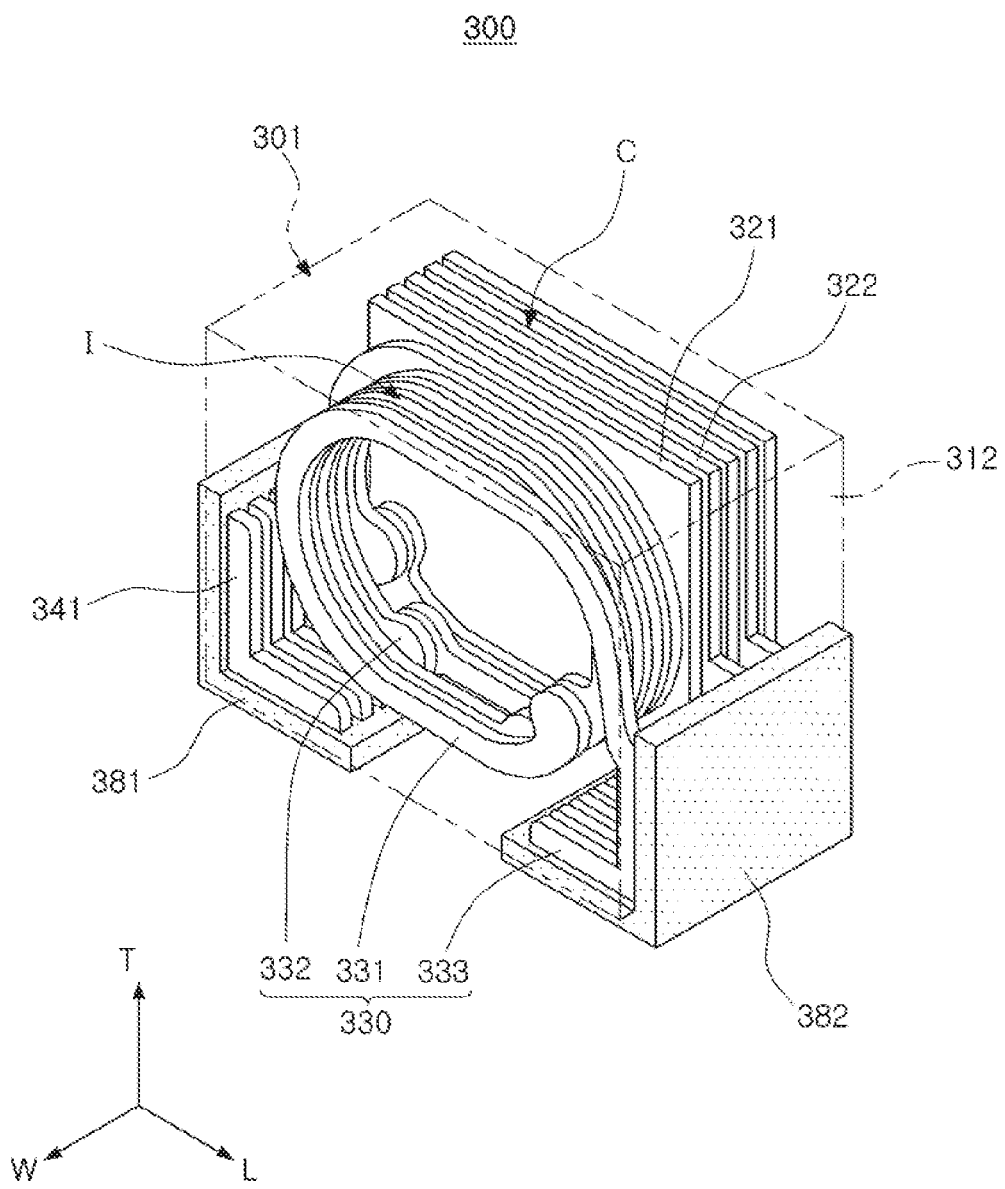
FIG. 7 is a schematic perspective view illustrating a composite electronic component according to a third exemplary embodiment in the present disclosure.
Figure 8:
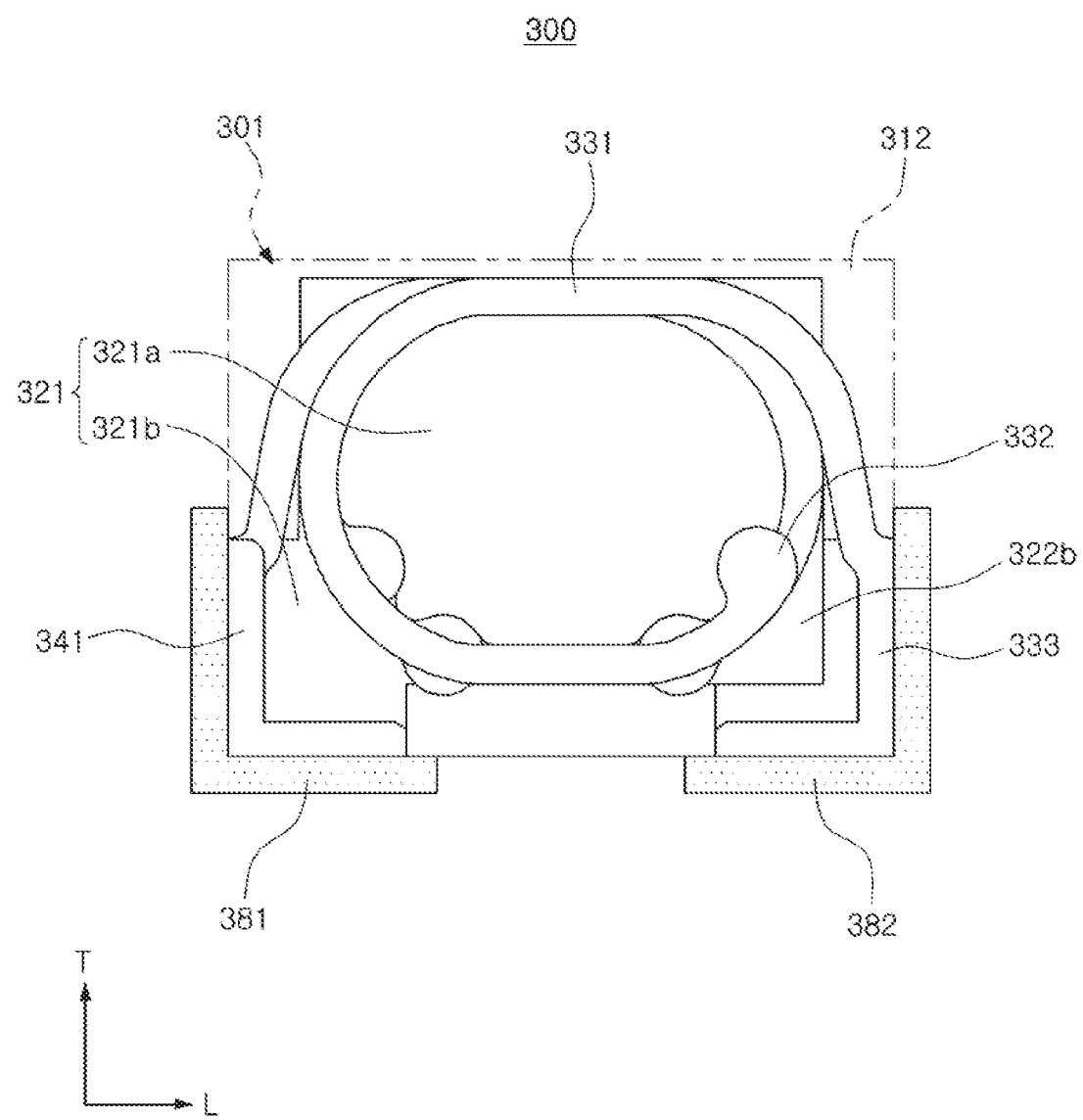
FIG. 8 is a schematic front view illustrating the composite electronic component of FIG. 7.
Figure 9:
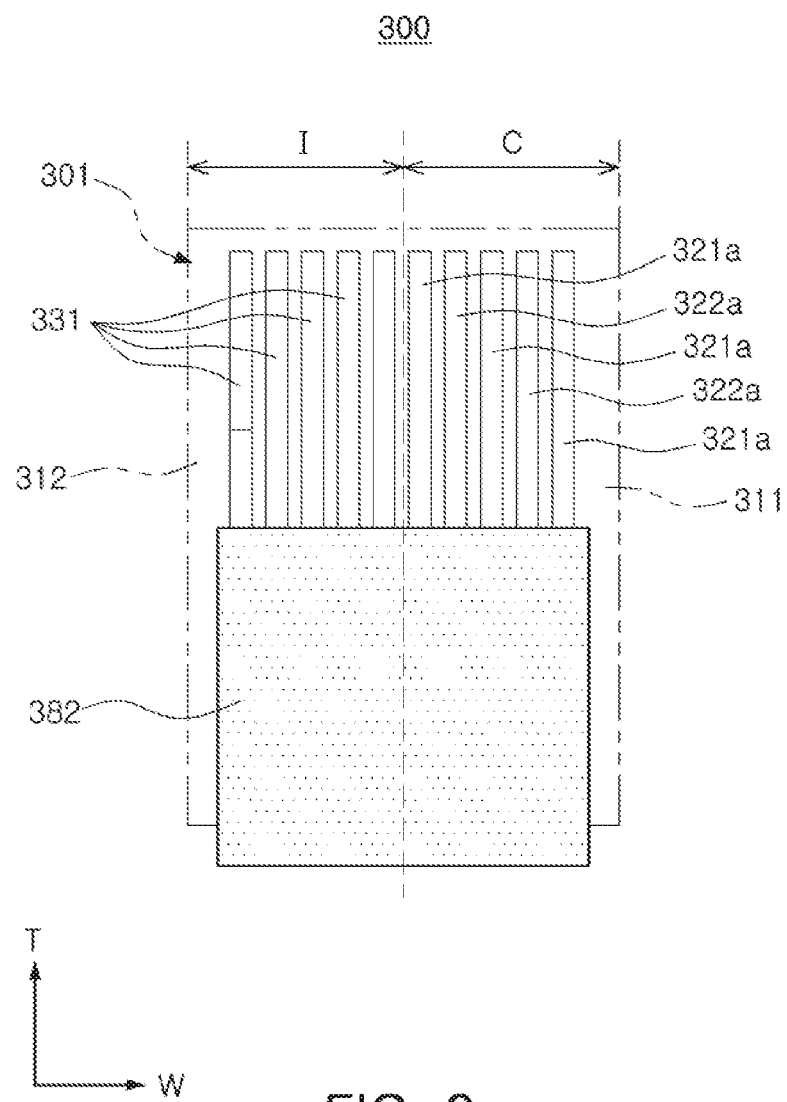
FIG. 9 is a schematic side view illustrating the composite electronic component of FIG. 7.
Figure 10:
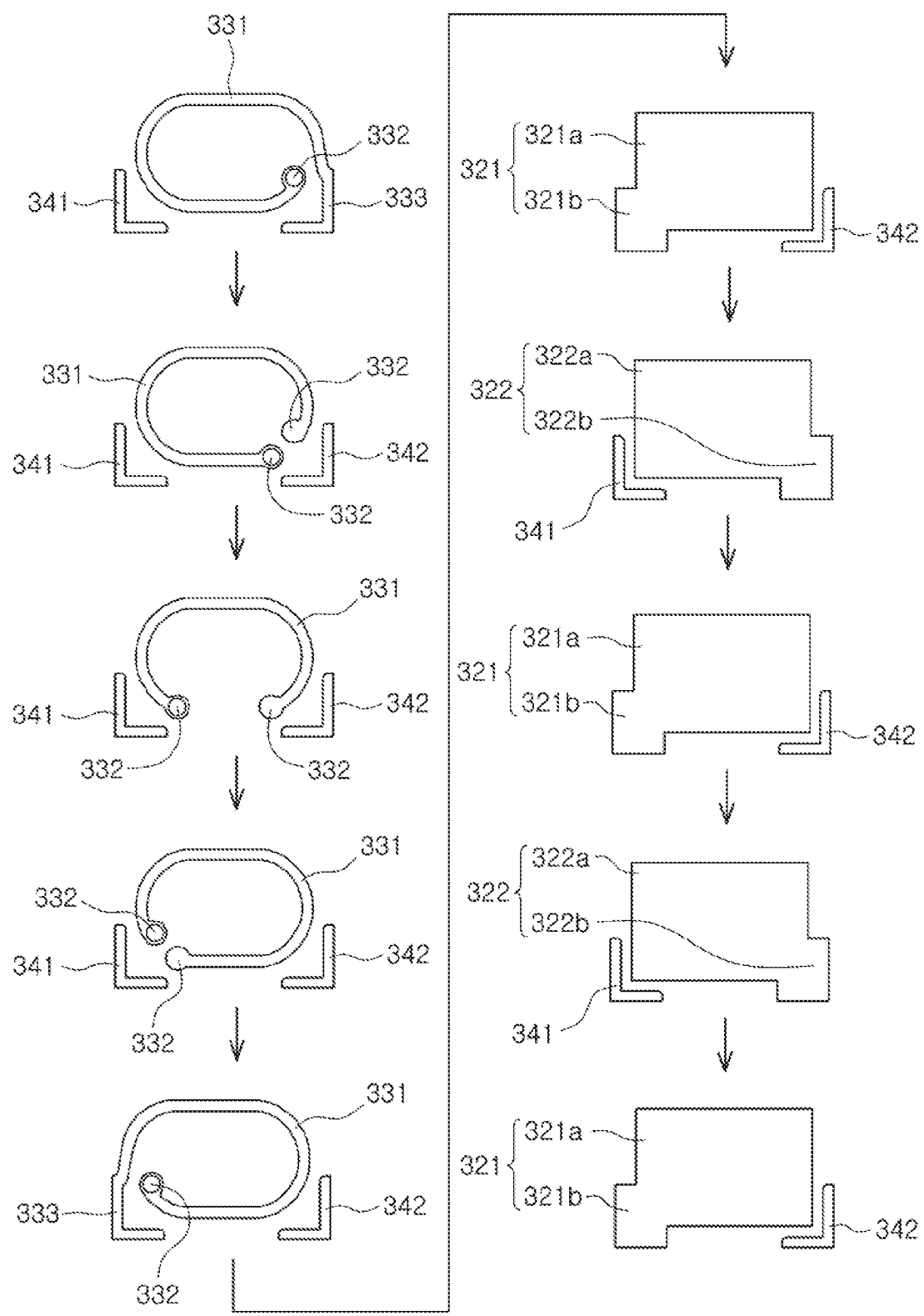
FIG. 10 is a plan view illustrating electrode patterns included in the composite electronic component of FIG. 7 depending on a stacking sequence.

FIG. 7 is a schematic perspective view illustrating a composite electronic component 300 according to a third exemplary embodiment in the present disclosure. FIG. 8 is a schematic front view illustrating the composite electronic component 300 of FIG. 7. FIG. 9 is a schematic side view illustrating the composite electronic component 300 of FIG. 7. FIG. 10 is a plan view illustrating electrode patterns included in the composite electronic component 300 of FIG. 7 depending on a stacking sequence.

The composite electronic component 300 according to the third exemplary embodiment will be described with reference to FIGS. 7 through 10.

A body 301 of the composite electronic component 300 according to the third exemplary embodiment may be formed by stacking a plurality of insulating layers 311 and 312 in the first direction, parallel to the mounting surface.

The body 301 may include a capacitor unit C and an inductor unit I, and the capacitor unit C and the inductor unit I may be disposed, respectively, on both sides of the body 301 in the first direction. That is, referring to FIG. 9, the capacitor unit C and the inductor unit I may be disposed, respectively, at the front and the rear of the body in the W direction.

First insulating layers 311 refer to insulating layers disposed in the capacitor unit C, and second insulating layers 312 refer to insulating layers disposed in the inductor unit I.

The first and second insulating layers 311 and 312 may be formed of the same material, but may also be formed of different materials, if necessary.

When the first and second insulating layers 311 and 312 are formed of the different materials, the first insulating layer 311 may be a dielectric layer, and the second insulating layer 312 may be a magnetic layer. In the composite electronic component 300 according to the third exemplary embodiment, since the capacitor unit C and the inductor unit I are disposed in a stacked direction, the body 301 may be formed by forming the first and second insulating layers 311 and 312 using the different materials, forming internal electrodes on the first insulating layers 311, forming coil patterns, and the like, on the second insulating layers 312, and then stacking the first and second insulating layers 311 and 312 as illustrated in FIG. 10.

The capacitor unit C may include first internal electrodes 321 and second internal electrodes 322 disposed with respective first insulating layers 311 interposed therebetween.

The first and second internal electrodes 321 and 322 may include first and second capacitor capacitance portions 321a and 322a and first and second capacitor lead portions 321b and 322b, respectively.

The first and second capacitor capacitance portions 321a and 322a may be portions in which the first and second internal electrodes 321 and 322 overlap each other with respective first insulating layers 311 interposed therebetween, and may form capacitance.

The first and second capacitor capacitance portions 321a and 322a may be connected to first and second external electrodes 381 and 382 to be described below through the first and second capacitor lead portions 321b and 322b, respectively.

The inductor unit I may include a coil 330 formed by connecting coil patterns 331 disposed on the second insulating layers 312 and having a spiral shape together through coil connection parts 332.

FIG. 8 shows that the coil 330 forms a spiral trajectory when viewed in the first direction. The end portions of the coil 330 may respectively be connected to the first and second external electrodes 381 and 382 through coil lead portions 333. However, the end portions of the coil 330 are not limited thereto. That is, when the composite electronic component 300 according to the third exemplary embodiment includes third and fourth external electrodes (not illustrated) disposed on the mounting surface spaced apart from the first and second external electrodes 381 and 382 in the first direction, the end portions of the coil 330 may respectively be connected to the third and fourth external electrodes through coil lead portions 333. That is, the first and second internal electrodes 321 and 322 of the capacitor unit C may be connected to the first and second external electrodes, respectively, and the end portions of the coil 330 may respectively be connected to the third and fourth external electrodes.

In the composite electronic component 300 according to the third exemplary embodiment, when both of the capacitor unit C and the inductor unit I are connected to the first and second external electrodes 381 and 382, the capacitor unit C and the inductor unit I may be connected to each other in parallel.

Referring to FIG. 10, the internal electrodes 321 and 322 and the coil patterns 331 may be formed separately.

The first internal electrode 321 and the second internal electrode 322 may be formed on the first insulating layers 311, the coil patterns 331 may be formed on the second insulating layers 312, and the first and second insulating layers 311 and 312 may be stacked and compressed in a sequence as illustrated in FIG. 10.

In the composite electronic component 300 according to the third exemplary embodiment, the internal electrodes 321 and 322 and the coil patterns 331 may be disposed to be perpendicular to the mounting surface to thus prevent a magnetic flux generated from the inductor unit from being affected by the mounting surface of the board.

The coil patterns 331 adjacent to each other may be connected to each other through the coil connection parts 332. The coil connection parts 332 may have line widths greater than those of the coil patterns 331, and include conductive vias penetrating through the insulating layers.

In the composite electronic component 300 according to the third exemplary embodiment, the insulating layers of the capacitor unit C and the insulating layer of the inductor unit I may be formed using different materials without performing an additional process.

Dummy electrodes 341 and 342 may be disposed on portions of the insulating layers in contact with the external electrodes 381 and 382, respectively. The dummy electrodes 341 and 342 may serve to improve close adhesion between the external electrodes 381 and 382 and the body 301, and may serve as a bridge when the external electrodes are formed by plating.

The external electrodes 381 and 382 may be disposed on external surfaces of the body 301. For example, the external electrodes 381 and 382 may be disposed on a surface provided as the mounting surface when the composite electronic component 300 is mounted on the board.

The capacitor lead portions of the internal electrodes 321 and 322 and the coil lead portions of the coil 330 may be exposed to the mounting surface, such that the internal electrodes 321 and 322 and the coil 330 may be connected to one of the external electrodes 381 and 382.

The external electrodes 381 and 382 may include the first and second external electrodes 381 and 382 disposed, respectively, on edges of the mounting surface of the body 301 in the second direction, spaced apart from each other.

The composite electronic component 300 according to the third exemplary embodiment including both of the capacitor and the inductor may be mounted in an area in which one electronic component may be mounted, resulting in a significant increase in a degree of freedom of a design and mounting efficiency.

The contents described in the third exemplary embodiment may hereinafter be applied to other exemplary embodiments.

Figure 11:
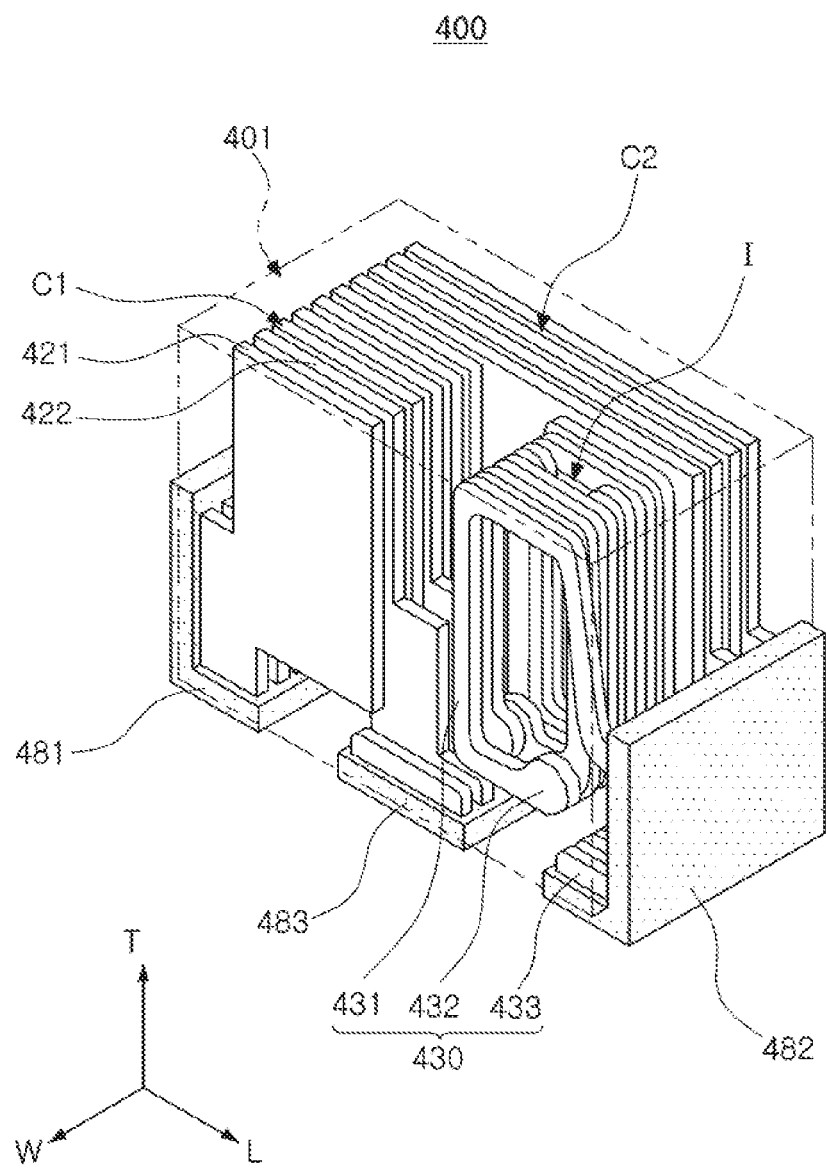
FIG. 11 is a schematic perspective view illustrating a composite electronic component according to a fourth exemplary embodiment in the present disclosure.
Figure 12:
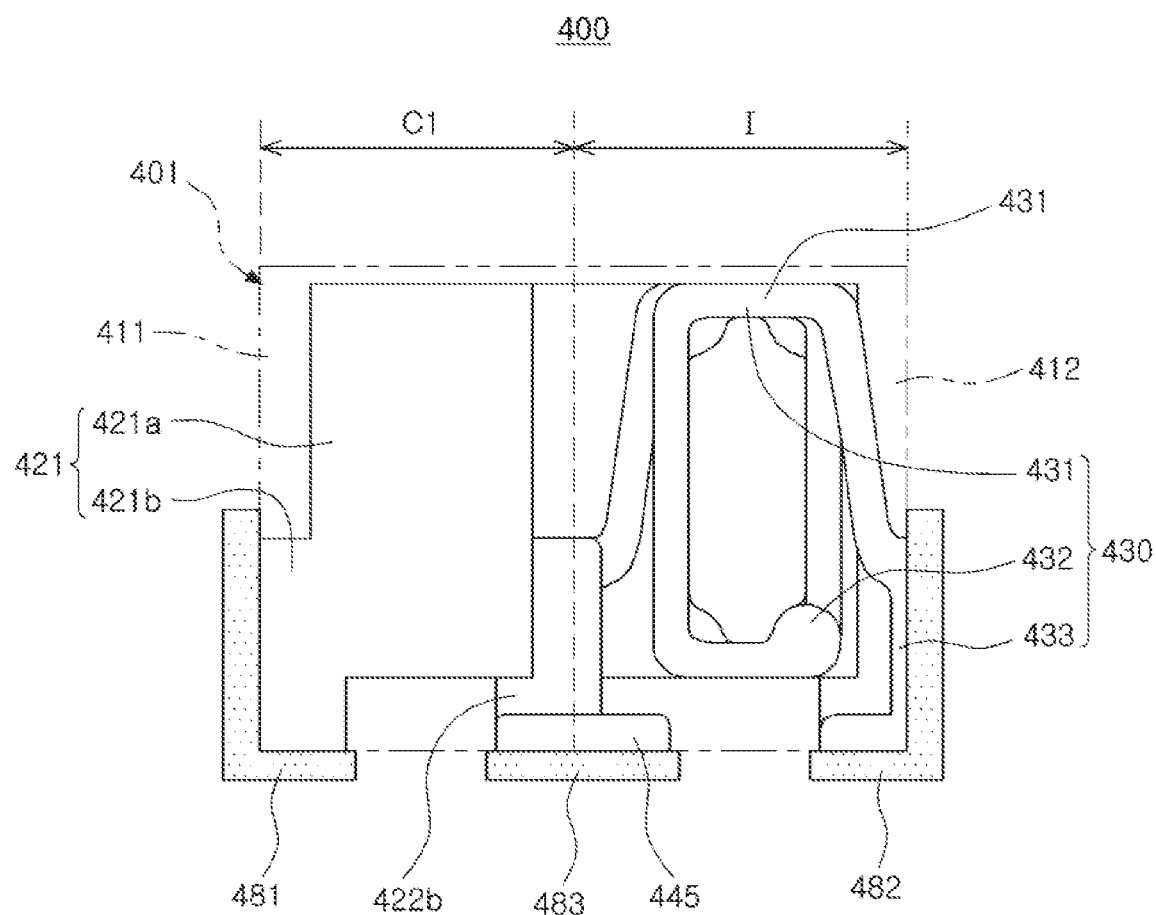
FIG. 12 is a schematic front view illustrating the composite electronic component of FIG. 11.
Figure 13:
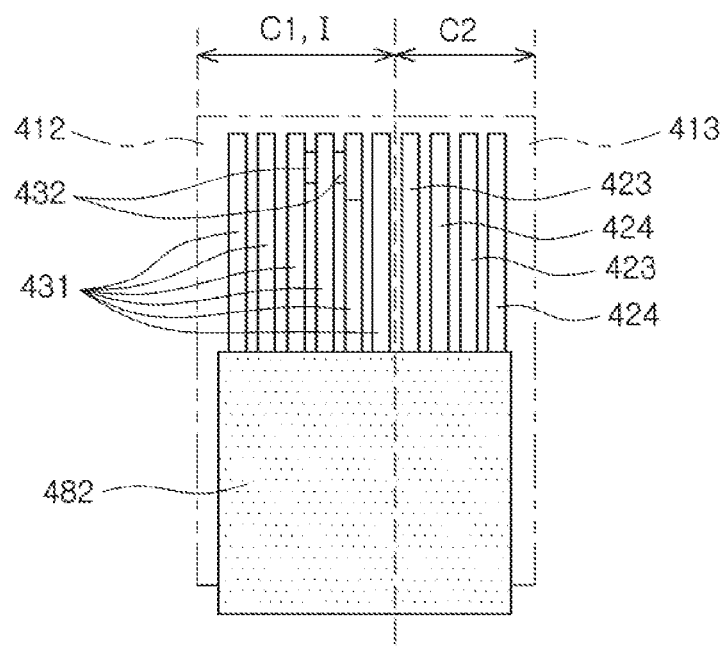
FIG. 13 is a schematic side view illustrating the composite electronic component of FIG. 11.

FIG. 11 is a schematic perspective view illustrating a composite electronic component 400 according to a fourth exemplary embodiment in the present disclosure. FIG. 12 is a schematic front view illustrating the composite electronic component 400 of FIG. 11. FIG. 13 is a schematic side view illustrating the composite electronic component 400 of FIG. 11.

A body 401 of the composite electronic component 400 according to the fourth exemplary embodiment may be formed by stacking a plurality of insulating layers 411, 412, and 413 in the first direction, parallel to the mounting surface.

The body 401 may include first and second capacitor units C1 and C2 and an inductor unit I.

The first capacitor unit C1 and the inductor unit I may be disposed, respectively, on both sides of the body 401 in the second direction, and may be disposed at one side of the body 401 in the first direction. Referring to FIG. 13, the first capacitor unit C1 and the inductor unit I may be disposed at the front of the body 401 in the W direction. In addition, the second capacitor unit C2 may be disposed on the other side of the body 401 in the first direction, that is, the rear of the body 401 in the W direction.

First insulating layers 411 refer to insulating layers disposed in the first capacitor unit C1, second insulating layers 412 refer to insulating layers disposed in the inductor unit I, and third insulating layers 413 refer to insulating layers disposed in the second capacitor unit C2.

The first to third insulating layers 411, 412, and 413 may be formed of the same material, but may also be formed of different materials, if necessary.

When the first to third insulating layers 411, 412, and 413 are formed of the different materials, the first and third insulating layers 411 and 413 may be dielectric layers, and the second insulating layer 412 may be a magnetic layer.

The first capacitor unit C1 may include first internal electrodes 421 and second internal electrodes 422 disposed with respective first insulating layers 411 interposed therebetween. The first and second internal electrodes 421 and 422 may include first and second capacitor capacitance portions 421*a* and first and second capacitor lead portions 421*b* and 422*b*, respectively. The first and second capacitor capacitance portions 421*a* may be formed in a flat plate shape to e elongated in the third direction perpendicular to the mounting surface. The first and second capacitor capacitance portions 421*a* may be portions in which the first and second internal electrodes 421 and 422 overlap each other with respective first insulating layers 411 interposed therebetween, and may form a capacitance. The first and second capacitor capacitance portions 421*a* may be connected to first and third external electrodes 481 and 483 to be described below through the first and second capacitor lead portions 421*b* and 422*b*, respectively.

The second capacitor unit C2 may include third internal electrodes 423 and fourth internal electrodes 424 disposed with each of the third insulating layers 413 interposed therebetween. The third and fourth internal electrodes 423 and 424 may also include third and fourth capacitor capacitance portions and third and fourth capacitor lead portions, respectively, similar to the first and second internal electrodes 421 and 422. The third and fourth capacitor capacitance portions may be formed in a flat plate shape over entire surfaces of the third insulating layers 413. The third and fourth capacitor capacitance portions may be portions in which the third and fourth internal electrodes 423 and 424 overlap each other with each of the third insulating layers 413 interposed therebetween, and may form a capacitance. The third and fourth capacitor capacitance portions may be connected to first and second external electrodes 481 and 482 to be described below through the third and fourth capacitor lead portions, respectively.

The inductor unit I may include a coil 430 formed by connecting coil patterns 431 disposed on the second insulating layers 412 and having a spiral shape together through coil connection parts 432.

FIG. 12 shows that the coil 430 forms a spiral trajectory when viewed in the first direction. The end portions of the coil 430 may respectively be connected to the second and third external electrodes 482 and 483 through coil lead portions 433.

In the composite electronic component 400 according to the fourth exemplary embodiment, the third external electrode 483 may serve as a connection electrode to connect the first capacitor unit C1 and the inductor unit I to each other in series. In addition, the first capacitor unit C1 and the inductor unit I may be connected to the second capacitor unit C2 in parallel.

However, the composite electronic component 400 according to the fourth exemplary embodiment is not limited thereto. That is, when the composite electronic component 400 according to the fourth exemplary embodiment includes fourth and fifth external electrodes (not illustrated) disposed on the mounting surface spaced apart from the first and second external electrodes 481 and 482 in the first direction, the capacitor lead portions of the third and fourth internal electrodes may be connected to the fourth and fifth external electrodes, respectively. That is, the first capacitor unit C1 and the inductor unit I may be connected to at least one of the first to third external electrodes 481, 482, and 483, and the second capacitor unit C2 may be connected to the fourth and fifth external electrodes.

In the composite electronic component 400 according to the fourth exemplary embodiment, the internal electrodes 421, 422, 423, and 424 and the coil patterns 431 may be disposed to be perpendicular to the mounting surface to thus prevent a magnetic flux generated from the inductor unit from being affected by the mounting surface of the board.

The coil patterns 431 adjacent to each other may be connected to each other through the coil connection parts 432. The coil connection parts 432 may have line widths greater than those of the coil patterns 431, and include conductive vias penetrating through the insulating layers.

Dummy electrodes 441, 442, and 445 may be disposed on portions of the insulating layers in contact with the external electrodes 481, 482, and 483, respectively. The dummy electrodes 441, 442, and 445 may serve to improve close adhesion between the external electrodes 481, 482, and 483 and the body 401, and may serve as a bridge when the external electrodes are formed by plating.

The external electrodes 481, 482, and 483 may be disposed on external surfaces of the body 401. For example, the external electrodes 481, 482, and 483 may be disposed on a surface provided as the mounting surface when the composite electronic component 400 is mounted on the board.

The capacitor lead portions of the internal electrodes 421, 422, 423, and 424 and the coil lead portions of the coil 430 may be exposed to the mounting surface, such that the internal electrodes 421, 422, 423, and 424 and the coil 430 may be connected to one of the external electrodes 481, 482, and 483.

The external electrodes 481, 482, and 483 may include the first and second external electrodes 481 and 482 disposed, respectively, on edges of the mounting surface of the body 401 in the second direction, spaced apart from each other, and the third external electrode 483 disposed between the first and second external electrodes 481 and 482.

Figure 23:
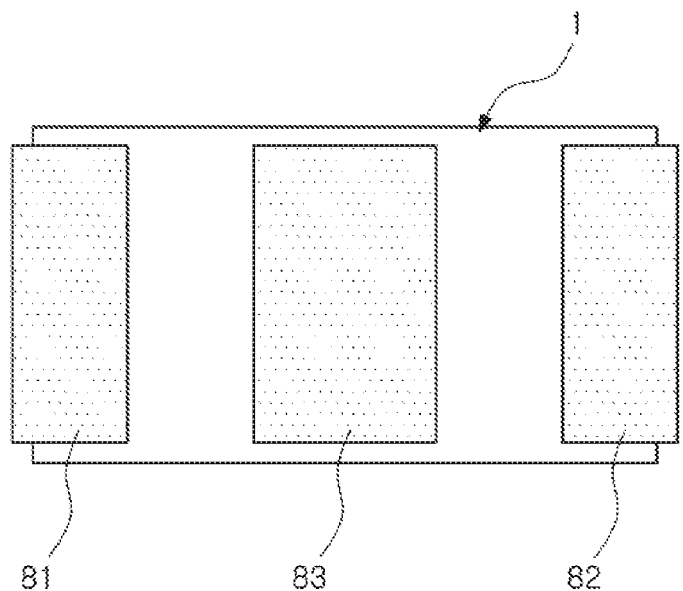
FIGS. 23 and 24 are illustrative views illustrating external electrodes when the number of external electrodes is three.
Figure 24:
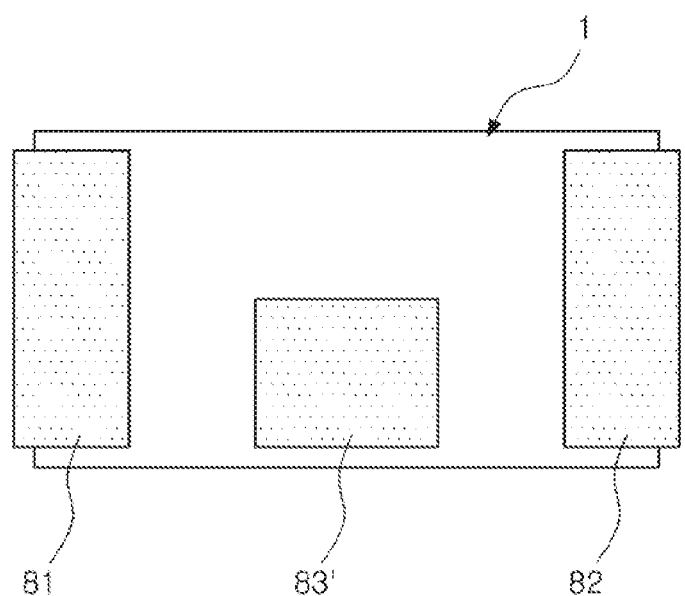

The third external electrode 483 may have a shape in which it extends from a central portion of the mounting surface to both sides of the mounting surface in the first direction as in a third external electrode 83 of FIG. 23 or a shape in which it extends from a central portion of the mounting surface to one side of the mounting surface in the first direction, that is, to a portion in which the inductor unit is disposed, as in a third external electrode 83' of FIG. 24.

The composite electronic component 400 according to the fourth exemplary embodiment including all of the first and second capacitors and the inductor may be mounted in an area in which one electronic component may be mounted, resulting in a significant increase in a degree of freedom of a design and mounting efficiency.

The contents described in the fourth exemplary embodiment may hereinafter be applied to other exemplary embodiments.

Figure 14:
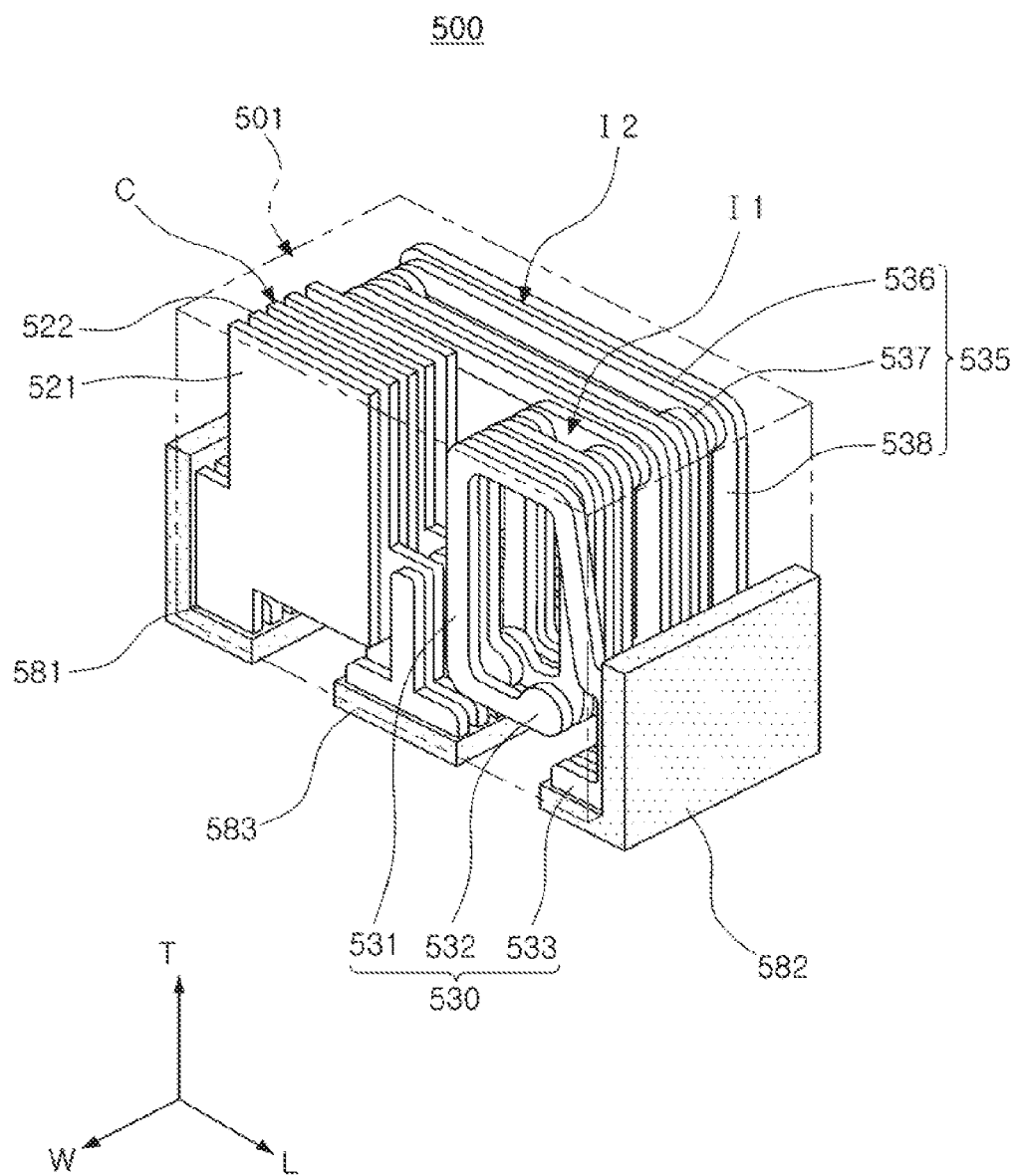
FIG. 14 is a schematic perspective view illustrating a composite electronic component according to a fifth exemplary embodiment in the present disclosure.
Figure 15:
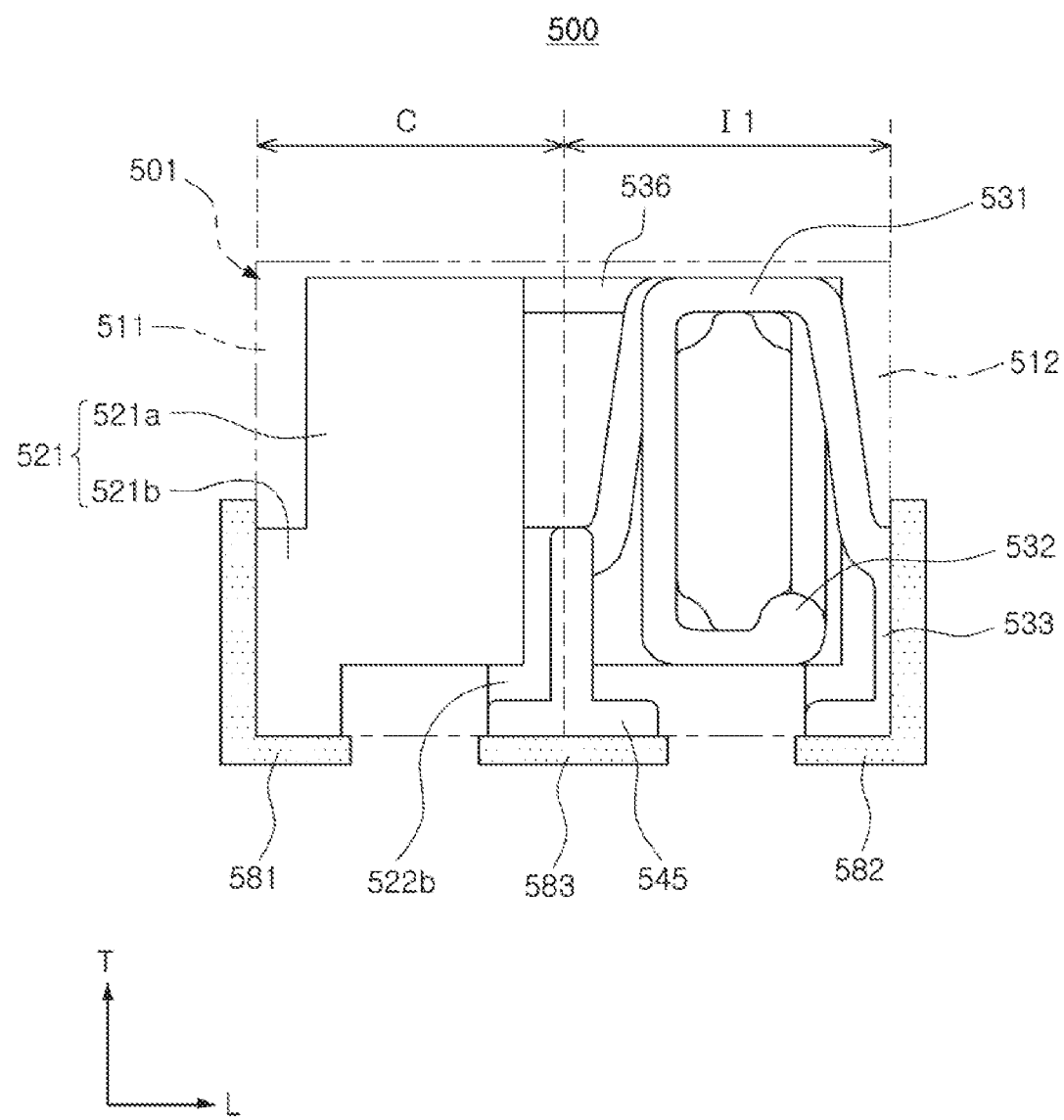
FIG. 15 is a schematic front view illustrating the composite electronic component of FIG. 14.
Figure 16:
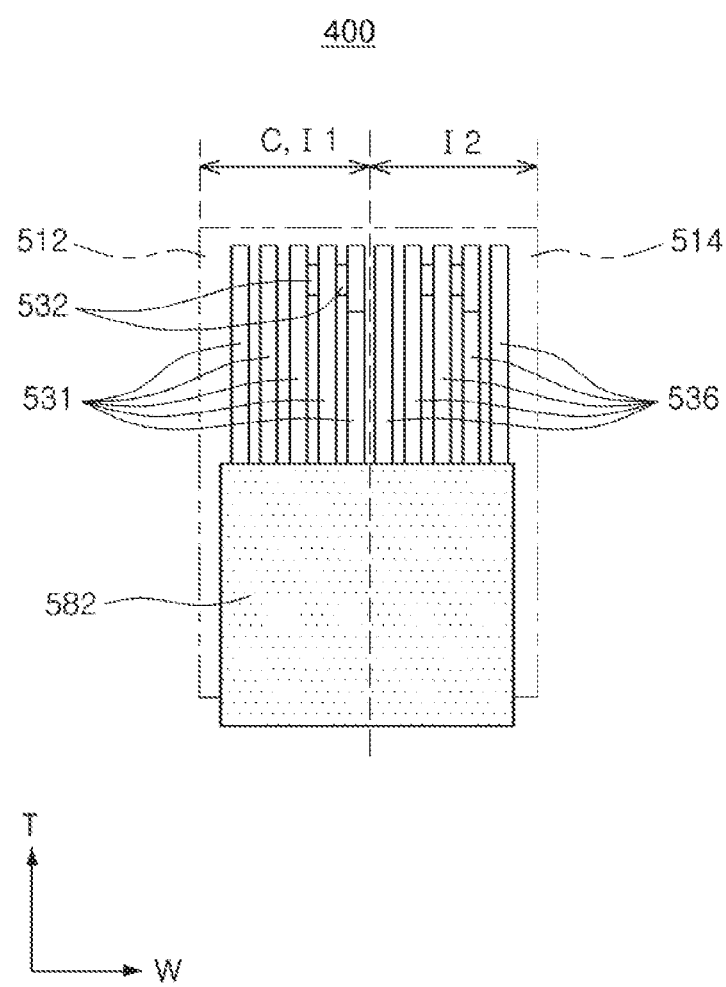
FIG. 16 is a schematic side view illustrating the composite electronic component of FIG. 14.

FIG. 14 is a schematic perspective view illustrating a composite electronic component 500 according to a fifth exemplary embodiment in the present disclosure. FIG. 15 is a schematic front view illustrating the composite electronic component 500 of FIG. 14. FIG. 16 is a schematic side view illustrating the composite electronic component 500 of FIG. 14.

A body 501 of the composite electronic component 500 according to the fifth exemplary embodiment may be formed by stacking a plurality of insulating layers 511, 512, and 514 in the first direction, parallel to the mounting surface.

The body 501 may include a capacitor unit C and first and second inductor units I1 and I2.

The capacitor unit C and the first inductor unit I1 may be disposed, respectively, on both sides of the body 501 in the second direction, and may be disposed at one side of the body 501 in the first direction. That is, referring to FIG. 16, the capacitor unit C and the first inductor unit I may be disposed at the front of the body 501 in the W direction. In addition, the second inductor unit I2 may be disposed on the other side of the body 501 in the first direction, that is, the rear of the body 501 in the W direction.

First insulating layers 511 refer to insulating layers disposed in the capacitor unit C, second insulating layers 512 refer to insulating layers disposed in the first inductor unit I1, and third insulating layers 514 refer to insulating layers disposed in the second inductor unit I2.

The first to third insulating layers 511, 512, and 514 may be formed of the same material, but may also be formed of different materials, if necessary.

When the first to third insulating layers 511, 512, and 514 are formed of the different materials, the first insulating layer 511 may be a dielectric layer, and the second and third insulating layers 512 and 514 may be magnetic layers.

The capacitor unit C may include first internal electrodes 521 and second internal electrodes 522 disposed with respective first insulating layers 511 interposed therebetween. The first and second internal electrodes 521 and 522 may include first and second capacitor capacitance portions 521a and first and second capacitor lead portions 521b and 522b, respectively. The first and second capacitor capacitance portions 521a may be formed in a flat plate shape to be elongated in the third direction perpendicular to the mounting surface. The first and second capacitor capacitance portions 521a may be portions in which the first and second internal electrodes 521 and 522 overlap each other with respective first insulating layers 511 interposed therebetween, and may form a capacitance. The first and second capacitor capacitance portions 521a may be connected to first and third external electrodes 581 and 583 to be described below through the first and second capacitor lead portions 521b and 522b, respectively.

The first inductor unit I1 may include a first coil 530 formed by connecting first coil patterns 531 disposed on the second insulating layers 512 and having a spiral shape together through first coil connection parts 532. FIG. 15 shows that the first coil 530 forms a spiral trajectory when viewed in the first direction. The end portions of the first coil 530 may respectively be connected to second and third external electrodes 582 and 583 through first coil lead portions 533.

The second inductor unit I2 may include a second coil 535 formed by connecting second coil patterns 536 disposed on the third insulating layers 514 and having a spiral shape together through second coil connection parts 537. The second coil 535 forms a spiral trajectory when viewed in the first direction. The end portions of the second coil 535 may respectively be connected to the first and third external electrodes 581 and 583 through second coil lead portions 538.

In the composite electronic component 500 according to the fifth exemplary embodiment, the third external electrode 583 may serve as a connection electrode to connect the capacitor unit C and the first inductor unit I1 to each other in series. In addition, the capacitor unit C and the first inductor unit I1 may be connected to the second inductor unit I2 in parallel.

However, the composite electronic component 500 according to the fifth exemplary embodiment is not limited thereto. That is, when the composite electronic component 500 according to the fifth exemplary embodiment includes fourth and fifth external electrodes (not illustrated) disposed on the mounting surface spaced apart from the first and second external electrodes 581 and 582 in the first direction, the coil lead portions of the second coil 535 may be connected to the fourth and fifth external electrodes, respectively. That is, the capacitor unit C and the first inductor unit I1 may be connected to at least one of the first to third external electrodes 581, 582, and 583, and the second inductor unit I2 may be connected to the fourth and fifth external electrodes.

In the composite electronic component 500 according to the fifth exemplary embodiment, the internal electrodes 521 and 522 and the coil patterns 531 and 536 may be disposed to be perpendicular to the mounting surface to thus prevent magnetic fluxes generated from the inductor units from being affected by the mounting surface of the board.

The first coil patterns 531 adjacent to each other may be connected to each other through the first coil connection parts 532. The first coil connection parts 532 may have line widths greater than those of the first coil patterns 531, and include conductive vias penetrating through the insulating layers. In addition, the second coil patterns 536 adjacent to each other may be connected to each other through the second coil connection parts 537. The second coil connection parts 537 may have line widths greater than those of the second coil patterns 536, and include conductive vias penetrating through the insulating layers.

Dummy electrodes 541, 542, and 545 may be disposed on portions of the insulating layers in contact with the external electrodes 581, 582, and 583, respectively. The dummy electrodes 541, 542, and 545 may serve to improve close adhesion between the external electrodes 581, 582, and 583 and the body 501, and may serve as a bridge when the external electrodes are formed by plating.

The external electrodes 581, 582, and 583 may be disposed on external surfaces of the body 501. For example, the external electrodes 581, 582, and 583 may be disposed on a surface provided as the mounting surface when the composite electronic component 500 is mounted on the board.

The capacitor lead portions of the internal electrodes 521 and 522 and the coil lead portions of the coils 530 and 535 may be exposed to the mounting surface, such that the internal electrodes 521 and 522 and the coils 530 and 535 may be connected to one of the external electrodes 581, 582, and 583.

The external electrodes 581, 582, and 583 may include the first and second external electrodes 581 and 582 disposed, respectively, on edges of the mounting surface of the body 501 in the second direction, spaced apart from each other, and the third external electrode 583 disposed between the first and second external electrodes 581 and 582.

The third external electrode 583 may have a shape in which it extends from a central portion of the mounting surface to both sides of the mounting surface in the first direction as in the third external electrode 83 of FIG. 23 or a shape in which it extends from a central portion of the mounting surface to one side of the mounting surface in the first direction, that is, to a portion in which the capacitor unit is disposed, as in the third external electrode 83' of FIG. 24.

The composite electronic component 500 according to the fifth exemplary embodiment including all of the capacitor and the first and second inductors may be mounted in an area in which one electronic component may be mounted, resulting in a significant increase in a degree of freedom of a design and mounting efficiency.

The contents described in the fifth exemplary embodiment may hereinafter be applied to other exemplary embodiments.

Figure 17:
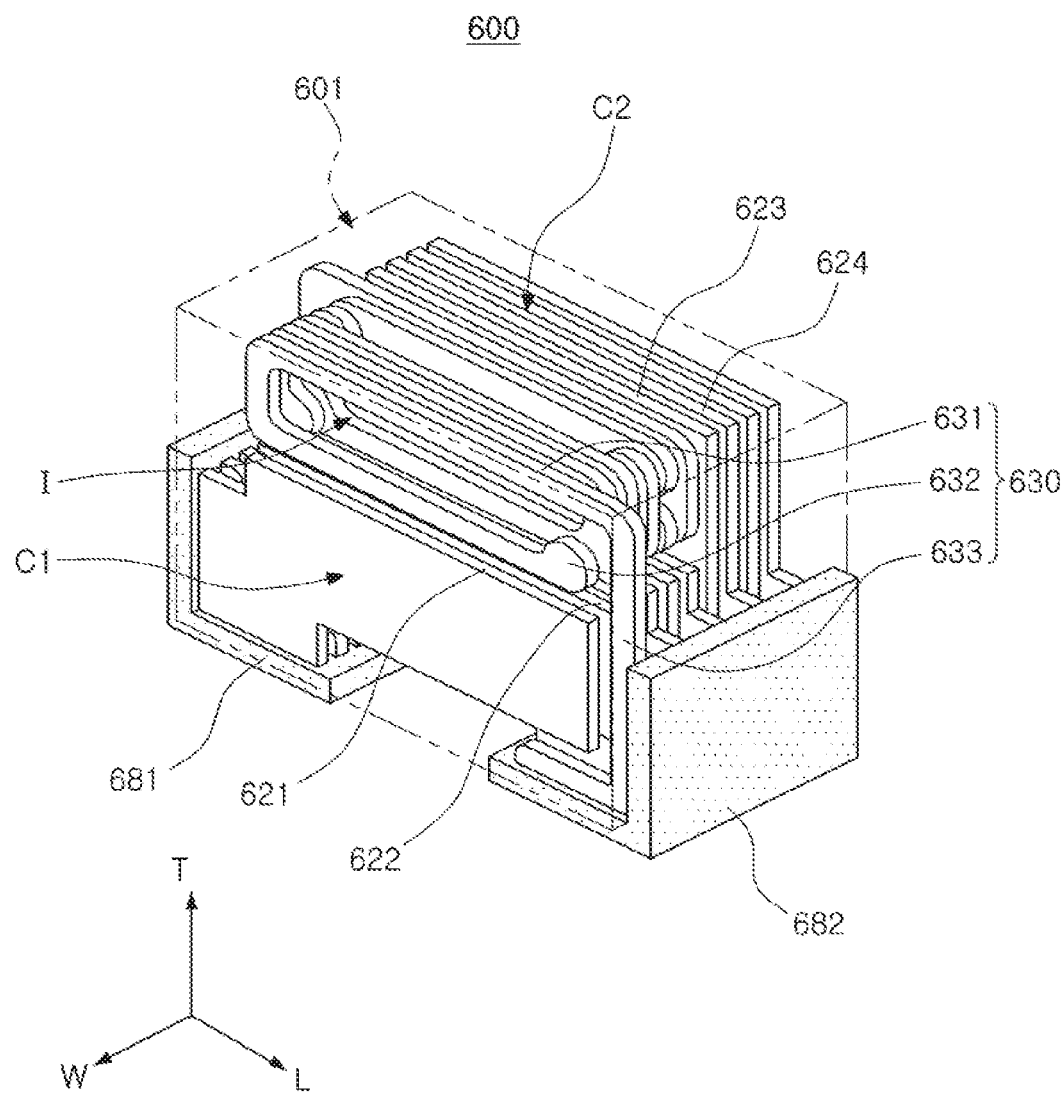
FIG. 17 is a schematic perspective view illustrating a composite electronic component according to a sixth exemplary embodiment in the present disclosure.
Figure 18:
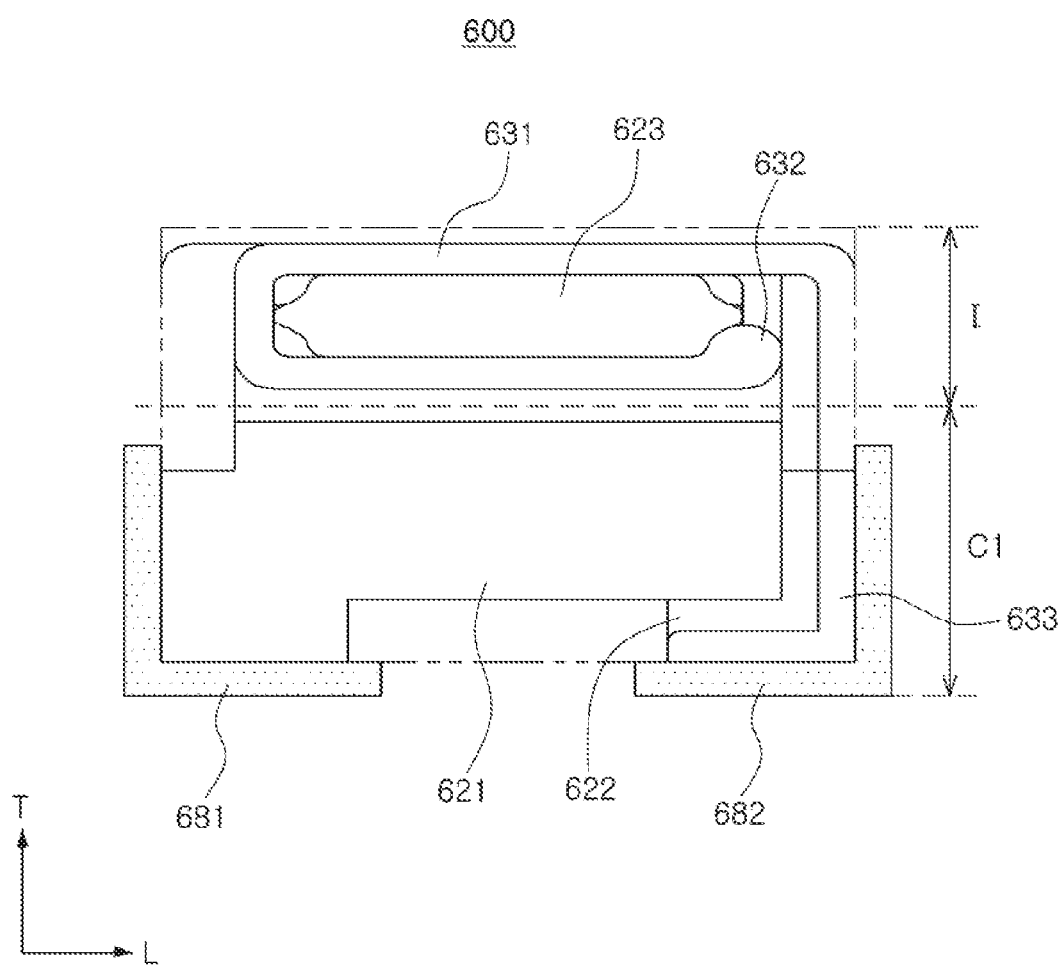
FIG. 18 is a schematic front view illustrating the composite electronic component of FIG. 17.
Figure 19:
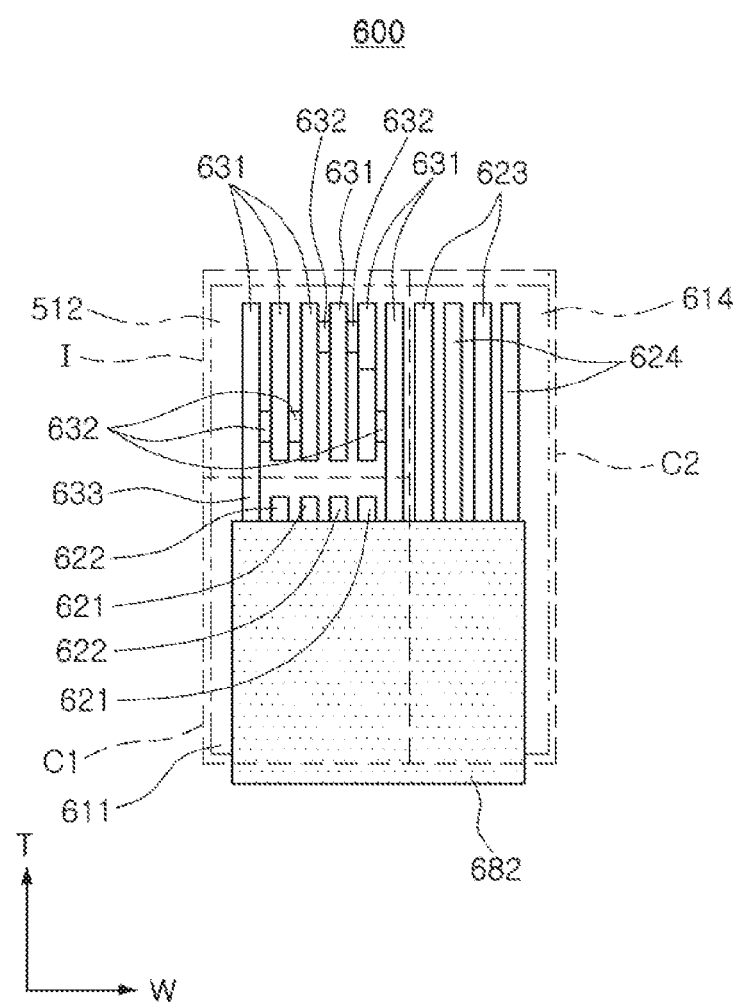
FIG. 19 is a schematic side view illustrating the composite electronic component of FIG. 17.

FIG. 17 is a schematic perspective view illustrating a composite electronic component 600 according to a sixth exemplary embodiment in the present disclosure. FIG. 18 is a schematic front view illustrating the composite electronic component 600 of FIG. 17. FIG. 19 is a schematic side view illustrating the composite electronic component 600 of FIG. 17.

A body 601 of the composite electronic component 600 according to the sixth exemplary embodiment may be formed by stacking a plurality of insulating layers 611, 612, and 613 in the first direction, parallel to the mounting surface.

The body 601 may include first and second capacitor units C1 and C2 and an inductor unit I.

The first capacitor unit C1 and the inductor unit I may be disposed, respectively, on upper and lower portions of the body 601 in the third direction, and may be disposed at one side of the body 601 in the first direction. That is, referring to FIG. 19, the first capacitor unit C1 and the inductor unit I may be disposed at the front of the body 601 in the W direction. In addition, the second capacitor unit C2 may be disposed on the other side of the body 601 in the first direction, that is, the rear of the body 601 in the W direction.

First insulating layers 611 refer to insulating layers disposed in the first capacitor unit C1, second insulating layers 612 refer to insulating layers disposed in the inductor unit I, and third insulating layers 613 refer to insulating layers disposed in the second capacitor unit C2.

The first to third insulating layers 611, 612, and 613 may be formed of the same material, but may also be formed of different materials, if necessary.

When the first to third insulating layers 611, 612, and 613 are formed of the different materials, the first and third insulating layers 611 and 613 may be dielectric layers, and the second insulating layer 612 may be a magnetic layer.

The first capacitor unit C1 may include first internal electrodes 621 and second internal electrodes 622 disposed with respective first insulating layers 611 interposed therebetween. The first and second internal electrodes 621 and 622 may include first and second capacitor capacitance portions and first and second capacitor lead portions, respectively. The first and second capacitor capacitance portions may be formed in a flat plate shape to be elongated in the second direction perpendicular to the first direction and parallel to the mounting surface. The first and second capacitor capacitance portions may be portions in which the first and second internal electrodes 621 and 622 overlap each other with respective first insulating layers 611 interposed therebetween, and may form a capacitance. The first and second capacitor capacitance portions may be connected to first and second external electrodes 681 and 682 to be described below through the first and second capacitor lead portions, respectively.

The second capacitor unit C2 may include third internal electrodes 623 and fourth internal electrodes 624 disposed with each of the third insulating layers 613 interposed therebetween. The third and fourth internal electrodes 623 and 624 may also include third and fourth capacitor capacitance portions and third and fourth capacitor lead portions, respectively, similar to the first and second internal electrodes 621 and 622. The third and fourth capacitor capacitance portions may be formed in a flat plate shape over entire surfaces of the third insulating layers 613. The third and fourth capacitor capacitance portions may be portions in which the third and fourth internal electrodes 623 and 624 overlap each other with each of the third insulating layers 613 interposed therebetween, and may form a capacitance. The third and fourth capacitor capacitance portions may be connected to first and second external electrodes 681 and 682 to be described below through the third and fourth capacitor lead portions, respectively.

The inductor unit I may include a coil 630 formed by connecting coil patterns 631 disposed on the second insulating layers 612 and having a spiral shape together through coil connection parts 632.

FIG. 18 shows that the coil 630 forms a spiral trajectory when viewed in the first direction. The coil 630 may be formed to be elongated in the second direction perpendicular to the first direction and parallel to the mounting surface when viewed in the first direction. The end portions of the coil 630 may respectively be connected to the first and second external electrodes 681 and 682 through coil lead portions 633.

In the composite electronic component 600 according to the sixth exemplary embodiment, the capacitor lead portions of the first and second capacitor units C1 and C2 and the coil lead portions of the inductor unit I may be connected to the first and second external electrodes 681 and 682, such that the first and second capacitor units C1 and C2 and the inductor unit I may be connected to each other in parallel, respectively.

However, the composite electronic component 600 according to the sixth exemplary embodiment is not limited thereto. That is, when the composite electronic component 600 according to the sixth exemplary embodiment includes third and fourth external electrodes (not illustrated) disposed on the mounting surface spaced apart from the first and second external electrodes 681 and 682 in the first direction, the capacitor lead portions of the third and fourth internal electrodes 623 and 624 may be connected to the third and fourth external electrodes, respectively. That is, the first capacitor unit C1 and the inductor unit I may be connected to the first and second external electrodes 681 and 682, and the second capacitor unit C2 may be connected to the third and fourth external electrodes.

In the composite electronic component 600 according to the sixth exemplary embodiment, the internal electrodes 621, 622, 623, and 624 and the coil patterns 631 may be disposed to be perpendicular to the mounting surface to thus prevent a magnetic flux generated from the inductor unit from being affected by the mounting surface of the board.

The coil patterns 631 adjacent to each other may be connected to each other through the coil connection parts 632. The coil connection parts 632 may have line widths greater than those of the coil patterns 631, and include conductive vias penetrating through the insulating layers.

Dummy electrodes 641 and 642 may be disposed on portions of the insulating layers in contact with the external electrodes 681 and 682, respectively. The dummy electrodes 641 and 642 may serve to improve close adhesion between the external electrodes 681 and 682 and the body 601, and may serve as a bridge when the external electrodes are formed by plating.

The external electrodes 681 and 682 may be disposed on external surfaces of the body 601. For example, the external electrodes 681 and 682 may be disposed on a surface provided as the mounting surface when the composite electronic component 600 is mounted on the board.

The capacitor lead portions of the internal electrodes 621, 622, 623, and 624 and the coil lead portions of the coil 630 may be exposed to the mounting surface, such that the internal electrodes 621, 622, 623, and 624 and the coil 630 may be connected to one of the external electrodes 681 and 682.

The external electrodes 681 and 682 may include the first and second external electrodes 681 and 682 disposed, respectively, on edges of the mounting surface of the body 601 in the second direction, spaced apart from each other.

The composite electronic component 600 according to the sixth exemplary embodiment including all of the first and second capacitors and the inductor may be mounted in an area in which one electronic component may be mounted, resulting in a significant increase in a degree of freedom of a design and mounting efficiency.

The contents described in the sixth exemplary embodiment may hereinafter be applied to other exemplary embodiments.

Figure 20:
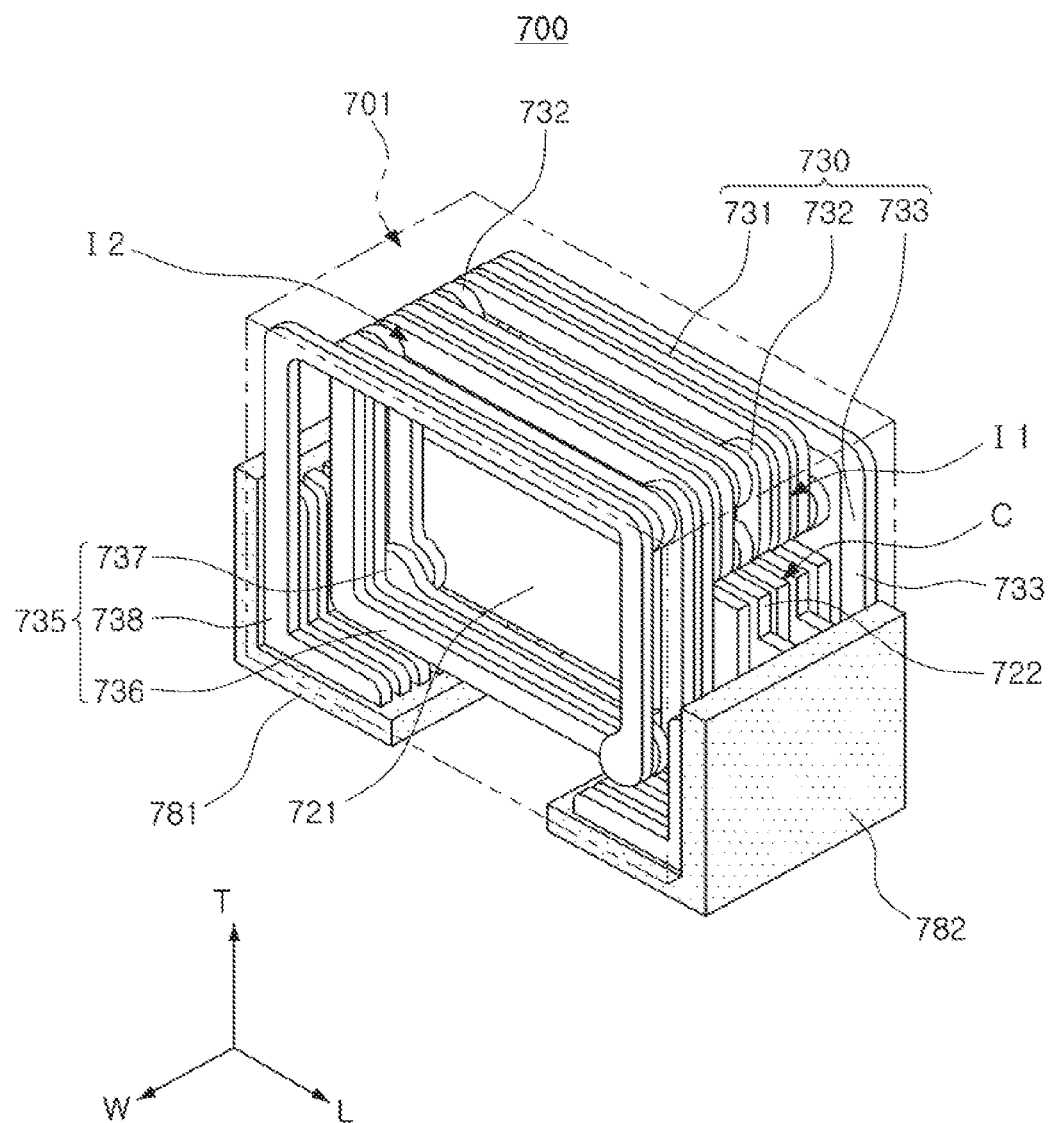
FIG. 20 is a schematic perspective view illustrating a composite electronic component according to a seventh exemplary embodiment in the present disclosure.
Figure 21:
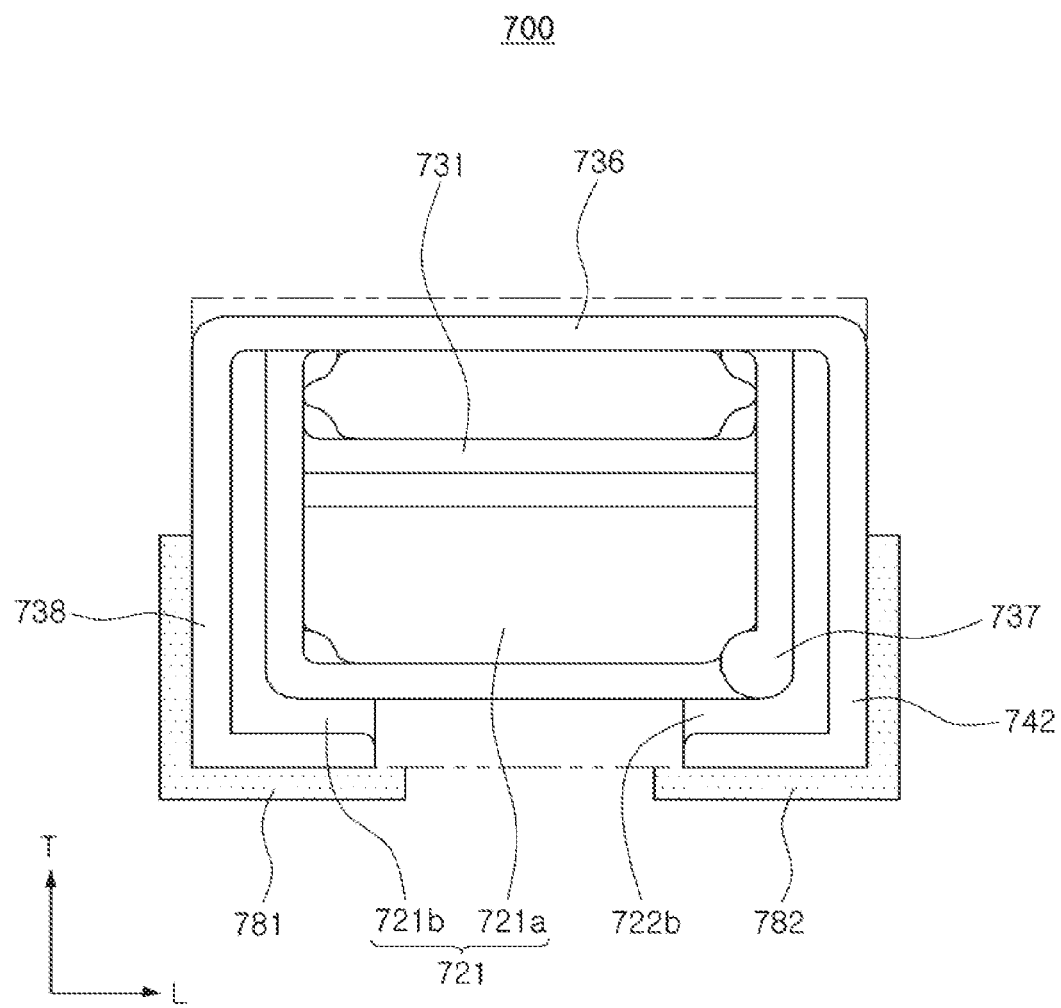
FIG. 21 is a schematic front view illustrating the composite electronic component of FIG. 20.
Figure 22:
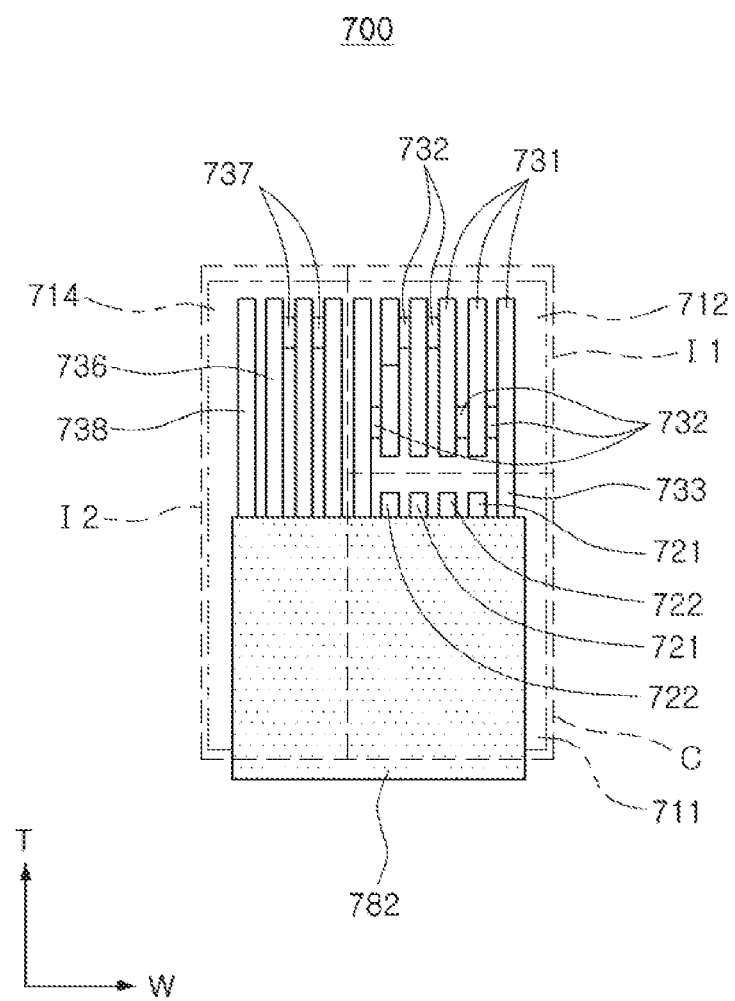
FIG. 22 is a schematic side view illustrating the composite electronic component of FIG. 20.

FIG. 20 is a schematic perspective view illustrating a composite electronic component 700 according to a seventh exemplary embodiment in the present disclosure. FIG. 21 is a schematic front view illustrating the composite electronic component 700 of FIG. 20. FIG. 22 is a schematic side view illustrating the composite electronic component 700 of FIG. 20.

A body 701 of the composite electronic component 700 according to the seventh exemplary embodiment may be formed by stacking a plurality of insulating layers 711, 712, and 714 in the first direction, parallel to the mounting surface.

The body 701 may include a capacitor unit C and first and second inductor units I1 and I2.

The capacitor unit C and the first inductor unit I1 may be disposed, respectively, on upper and lower portions of the body 701 in the third direction, and may be disposed at one side of the body 701 in the first direction. That is, referring to FIG. 22, the capacitor unit C and the first inductor unit I may be disposed at the rear of the body 701 in the W direction. In addition, the second inductor unit I2 may be disposed on the other side of the body 701 in the first direction, that is, the front of the body 701 in the W direction.

First insulating layers 711 refer to insulating layers disposed in the capacitor unit C, second insulating layers 712 refer to insulating layers disposed in the first inductor unit I1, and third insulating layers 714 refer to insulating layers disposed in the second inductor unit I2.

The first to third insulating layers 711, 712, and 714 may be formed of the same material, but may also be formed of different materials, if necessary.

When the first to third insulating layers 711, 712, and 714 are formed of the different materials, the first insulating layer 711 may be a dielectric layer, and the second and third insulating layers 712 and 714 may be magnetic layers.

The capacitor unit C may include first internal electrodes 721 and second internal electrodes 722 disposed with respective first insulating layers 711 interposed therebetween. The first and second internal electrodes 721 and 722 may include first and second capacitor capacitance portions 721a and 722a and first and second capacitor lead portions 721b and 722b, respectively. The first and second capacitor capacitance portions 721a and 722a may be formed in a flat plate shape to be elongated in the second direction perpendicular to the first direction and parallel to the mounting surface. The first and second capacitor capacitance portions 721a and 722a may be portions in which the first and second internal electrodes 721 and 722 overlap each other with respective first insulating layers 711 interposed therebetween, and may form a capacitance. The first and second capacitor capacitance portions 721a and 722a may be connected to first and second external electrodes 781 and 782 to be described below through the first and second capacitor lead portions 721b and 722b, respectively.

The first inductor unit I1 may include a first coil 730 formed by connecting first coil patterns 731 disposed on the second insulating layers 712 and having a spiral shape together through first coil connection parts 732. The first coil 730 forms a spiral trajectory when viewed in the first direction. The end portions of the first coil 730 may respectively be connected to first and second external electrodes 781 and 782 through first coil lead portions 733.

The second inductor unit I2 may include a second coil 735 formed by connecting second coil patterns 736 disposed on the third insulating layers 714 and having a spiral shape together through second coil connection parts 737. The second coil 735 forms a spiral trajectory when viewed in the first direction. The end portions of the second coil 735 may respectively be connected to the first and second external electrodes 781 and 782 through second coil lead portions 738.

In the composite electronic component 700 according to the seventh exemplary embodiment, the capacitor unit C and the first and second inductor units I1 and I2 may be connected to the first and second external electrodes 781 and 782, such that the capacitor unit C and the first and second inductor units I1 and I2 may be connected to each other in parallel.

However, the composite electronic component 700 according to the seventh exemplary embodiment is not limited thereto. That is, when the composite electronic component 700 according to the seventh exemplary embodiment includes third and fourth external electrodes (not illustrated) disposed on the mounting surface spaced apart from the first and second external electrodes 781 and 782 in the first direction, the coil lead portions of the second coil 735 may be connected to the third and fourth external electrodes, respectively. That is, the capacitor unit C and the first inductor unit I1 may be connected to at least one of the first and second external electrodes 781 and 782, and the second inductor unit I2 may be connected to the third and fourth external electrodes.

In the composite electronic component 700 according to the seventh exemplary embodiment, the internal electrodes 721 and 722 and the coil patterns 731 and 736 may be disposed to be perpendicular to the mounting surface to thus prevent magnetic fluxes generated from the inductor units from being affected by the mounting surface of the board.

The first coil patterns 731 adjacent to each other may be connected to each other through the first coil connection parts 732. The first coil connection parts 732 may have line widths greater than those of the first coil patterns 731, and include conductive vias penetrating through the insulating layers. In addition, the second coil patterns 736 adjacent to each other may be connected to each other through the second coil connection parts 737. The second coil connection parts 737 may have line widths greater than those of the second coil patterns 736, and include conductive vias penetrating through the insulating layers.

Dummy electrodes 741 and 742 may be disposed on portions of the insulating layers in contact with the external electrodes 781 and 782, respectively. The dummy electrodes 741 and 742 may serve to improve close adhesion between the external electrodes 781 and 782 and the body 701, and may serve as abridge when the external electrodes are formed by plating.

The external electrodes 781 and 782 may be disposed on external surfaces of the body 701. For example, the external electrodes 781 and 782 may be disposed on a surface provided as the mounting surface when the composite electronic component 700 is mounted on the board.

The capacitor lead portions of the internal electrodes 721 and 722 and the coil lead portions of the coils 730 and 735 may be exposed to the mounting surface, such that the internal electrodes 721 and 722 and the coils 730 and 735 may be connected to one of the external electrodes 781 and 782.

The external electrodes 781 and 782 may include the first and second external electrodes 781 and 782 disposed, respectively, on edges of the mounting surface of the body 701 in the second direction, spaced apart from each other.

The composite electronic component 700 according to the seventh exemplary embodiment including all of the capacitor and the first and second inductors may be mounted in an area in which one electronic component may be mounted, resulting in a significant increase in a degree of freedom of a design and mounting efficiency.

The contents described in the seventh exemplary embodiment may hereinafter be applied to other exemplary embodiments.

Board Having Composite Electronic Component

Figure 25:
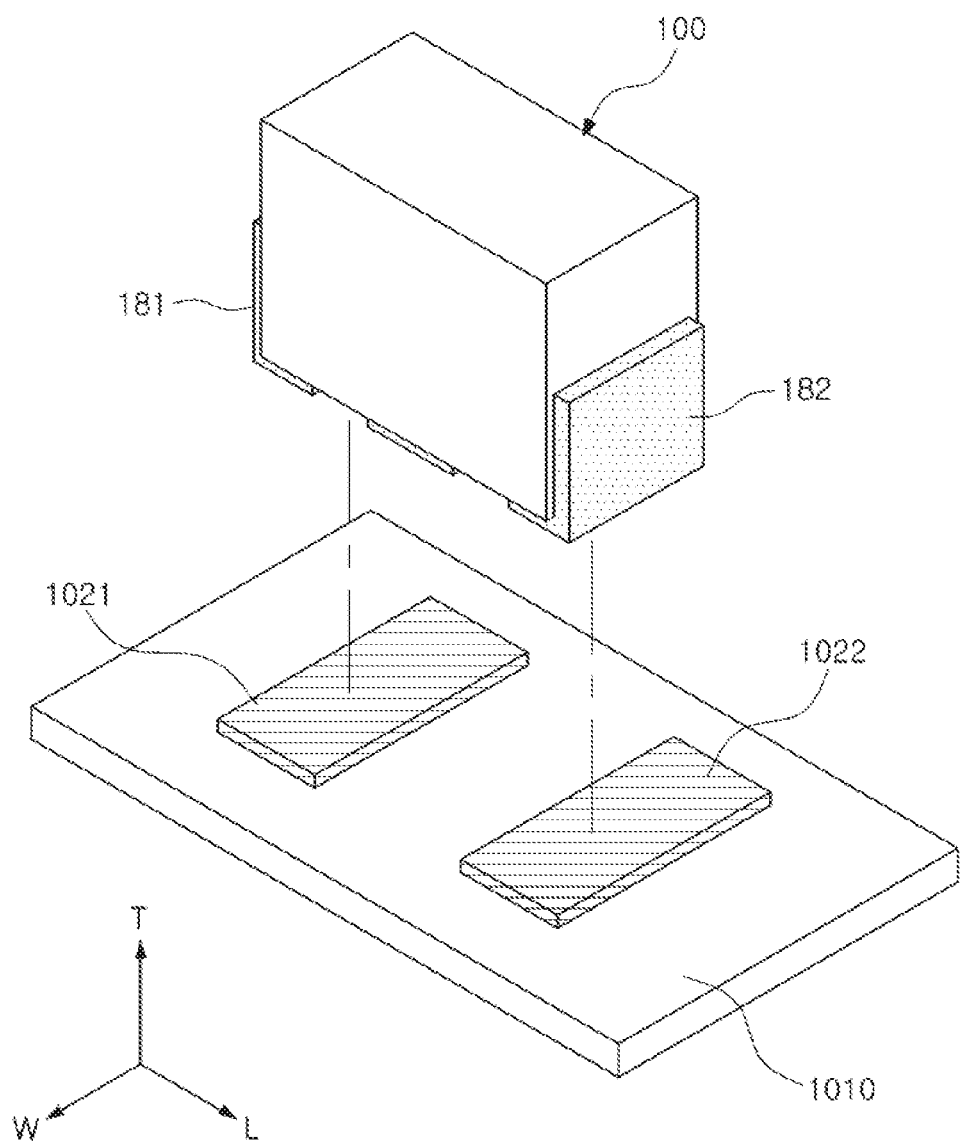
FIG. 25 is a schematic perspective view illustrating a composite electronic component mounting on a board according to another exemplary embodiment in the present disclosure.

FIG. 25 is a schematic perspective view illustrating a composite electronic component 100 mounting on a board according to another exemplary embodiment in the present disclosure.

Referring to FIG. 25, the board having a composite electronic component according to another exemplary embodiment in the present disclosure may include a printed circuit board 1010 having first and second electrode pads 1021 and 1022 disposed thereon and having a flat plate shape.

The composite electronic component 100 according to the first exemplary embodiment may be disposed on the printed circuit board 1010, but is not limited thereto. That is, at least one of the composite electronic components according to the second to seventh exemplary embodiments may be disposed on the printed circuit board 1010.

The first and second external electrodes 181 and 182 may be connected to the first and second electrode pads 1021 and 1022, respectively. The board having a composite electronic component according to another exemplary embodiment may further include a third electrode pad, if necessary, and the third external electrode 183 may be connected to the third electrode pad.

In the board having a composite electronic component according to another exemplary embodiment, the composite electronic component 100 including both the capacitor and the inductor may be mounted in an area in which one electronic component such as the inductor or the capacitor may be mounted, resulting in a significant increase in a degree of freedom of design and mounting efficiency.

As set forth above, in the composite electronic components according to the exemplary embodiments in the present disclosure, both the capacitor and the inductor may be included in a single component, and a mounting area may thus be significantly reduced.

In addition, in the composite electronic components according to the exemplary embodiments in the present disclosure, the internal electrodes and the coil patterns may be disposed to be perpendicular to the mounting surface to thus prevent the magnetic flux generated from the inductor unit from being affected by the mounting surface of the board.

While exemplary embodiments have been shown and described above, it will be apparent to those skilled in the art that modifications and variations could be made without departing from the scope of the present invention as defined by the appended claims.

What is claimed is:

1. A composite electronic component comprising:
   a body including a capacitor unit and an inductor unit and having a plurality of insulating layers stacked in a first direction parallel to a mounting surface of the body; and
   a plurality of external electrodes on external surfaces of the body,
   wherein the plurality of insulating layers include first and second insulating layers,
   the capacitor unit includes first and second internal electrodes alternately stacked with the first insulating layers respectively interposed therebetween in the first direction, and
   the inductor unit includes a coil including coil patterns having a spiral shape, stacked with the second insulating layers respectively interposed therebetween in the first direction, and connected together.

2. The composite electronic component of claim 1, wherein the plurality of external electrodes are disposed on the mounting surface of the body,
   the first and second internal electrodes are exposed at the mounting surface of the body and connected to respective external electrodes, and
   first and second end portions of the coil are exposed at the mounting surface of the body and connected to respective external electrodes.

3. The composite electronic component of claim 2, wherein the plurality of external electrodes include first and second external electrodes on respective edges of the mounting surface opposing each other in a second direction perpendicular to the first direction and parallel to the mounting surface, and a third external electrode on the mounting surface and between the first and second external electrodes,
   the first internal electrodes are connected to the first external electrode and the second internal electrodes are connected to the third external electrode, and
   first and second end portions of the coil are connected to the second and third external electrodes, respectively.

4. The composite electronic component of claim 3, wherein the third external electrode extends from a central portion of the mounting surface in the first direction.

5. The composite electronic component of claim 3, wherein the capacitor unit and the inductor unit are connected to each other in series.

6. The composite electronic component of claim 2, wherein the plurality of external electrodes include first and second external electrodes on respective edges of the mounting surface and opposing each other in a second direction perpendicular to the first direction and parallel to the mounting surface,
   the first internal electrodes are connected to the first external electrode and the second internal electrodes are connected to the second external electrode, and
   first and second end portions of the coil are connected to the first and second external electrodes, respectively.

7. The composite electronic component of claim 1, wherein the first insulating layers in the capacitor unit are dielectric layers and the second insulating layers in the inductor unit are magnetic layers.

8. The composite electronic component of claim 1, wherein the capacitor unit and the inductor unit are respectively located in opposing sides of the body in a second direction perpendicular to the first direction.

9. The composite electronic component of claim 1, wherein the capacitor unit and the inductor unit are disposed, respectively located in opposing sides of the body in the first direction.

10. The composite electronic component of claim 1, wherein the capacitor unit and the inductor unit are disposed, respectively, on both sides of the body in a third direction perpendicular to the first direction.

11. The composite electronic component of claim 1, wherein the capacitor unit includes a first capacitor unit including the first and second internal electrodes and a second capacitor unit including third and fourth internal electrodes, and
 in a second direction parallel to the mounting surface and perpendicular to the first direction and a third direction perpendicular to the first and second directions,
 the first capacitor unit and the inductor unit are respectively located in opposing sides of the body in the second direction and are both located in a first side of the body in the first direction, and
 the second capacitor unit is located in a second side of the body, opposing the first side, in the first direction.

12. The composite electronic component of claim 1, wherein the inductor unit includes a first inductor unit including a first coil and a second inductor unit including a second coil, and
 in a second direction parallel to the mounting surface and perpendicular to the first direction and a third direction perpendicular to the first and second directions,
 the capacitor unit and the first inductor unit are respectively located in opposing sides of the body in the second direction and are both at located in a first side of the body in the first direction, and
 the second inductor unit is located in a second side of the body, opposing the first side, in the first direction.

13. The composite electronic component of claim 1, wherein the capacitor unit includes a first capacitor unit including the first and second internal electrodes and a second capacitor unit including third and fourth internal electrodes, and
 in a second direction parallel to the mounting surface and perpendicular to the first direction and a third direction perpendicular to the first and second directions,
 the first capacitor unit and the inductor unit are respectively located in opposing sides of the body in the third direction and are both located in a first side of the body in the first direction, and
 the second capacitor unit is located in a second side of the body, opposing the first side, in the first direction.

14. The composite electronic component of claim 1, wherein the inductor unit includes a first inductor unit including a first coil and a second inductor unit including a second coil, and
 in a second direction parallel to the mounting surface and perpendicular to the first direction and a third direction perpendicular to the first and second directions,
 the capacitor unit and the first inductor unit are respectively located in opposing sides of the body in the third direction and are both located in a first side of the body in the first direction, and
 the second inductor unit is located in a second side of the body, opposing the first side, in the first direction.

15. A board having a composite electronic component, comprising:
 a printed circuit board having first and second electrode pads on one surface thereof; and
 the composite electronic component of claim 1, mounted on the printed circuit board.

16. A composite electronic component comprising:
 a plurality of first insulating layers stacked in a first direction parallel to a mounting surface of the stacked first insulating layers;
 first and second internal electrodes between each pair of adjacent stacked first insulating layers, alternately stacked in the first direction, and located on a first side of the first insulating layers in a second direction perpendicular to the first direction; and
 coil patterns between each pair of adjacent stacked first insulating layers, and located on a second side of the first insulating layers, opposing the first side, in the second direction.

17. The composite electronic component of claim 16, wherein:
 the second direction is parallel to the mounting surface of the stacked first insulating layers,
 the first internal electrodes each include a lead portion that extends away from the second side to a first end surface of the stacked first insulating layers and extends to the mounting surface,
 the second internal electrodes each include a lead portion that extends toward the second side and extends to the mounting surface,
 the coil patterns include a first outer coil pattern with a lead portion that extends away from the first side to a second end surface of the stacked first insulating layers opposing the first end surface and extends to the mounting surface, and
 the coil patterns include a second outer coil pattern with a lead portion that extends toward the first side and extends to the mounting surface.

18. The composite electronic component of claim 16, wherein:
 the second direction is perpendicular to the mounting surface of the stacked first insulating layers,
 the first internal electrodes each include a lead portion that extends in a third direction parallel to the mounting surface to a first end surface of the stacked first insulating layers and extends to the mounting surface,
 the second internal electrodes each include a lead portion that extends in the third direction to a second end surface of the stacked first insulating layers opposing the first end surface and extends to the mounting surface,
 the coil patterns include a first outer coil pattern with a lead portion that extends in the third direction to the first end surface and extends to the mounting surface, and
 the coil patterns include a second outer coil pattern with a lead portion that extends in the third direction to the second end surface and extends to the mounting surface.

19. The composite electronic component of claim 16, further comprising:
   a plurality of second insulating layers stacked in a first direction and adjacent to the stacked first insulating layers,
   wherein between each pair of adjacent stacked second insulating layers is one of third and fourth internal electrodes alternately stacked in the first direction, or coil patterns.

* * * * *